(12) United States Patent
Park et al.

(10) Patent No.: US 12,368,121 B2
(45) Date of Patent: Jul. 22, 2025

(54) SEMICONDUCTOR MEMORY DEVICE

(71) Applicant: SK hynix Inc., Icheon-si (KR)

(72) Inventors: Yu Jin Park, Icheon-si (KR); Nam Jae Lee, Icheon-si (KR); Eun Seok Choi, Icheon-si (KR)

(73) Assignee: SK hynix Inc., Icheon-si (KR)

(*) Notice: Subject to any disclaimer, the term of this patent is extended or adjusted under 35 U.S.C. 154(b) by 393 days.

(21) Appl. No.: 17/951,841

(22) Filed: Sep. 23, 2022

(65) Prior Publication Data
US 2023/0326891 A1    Oct. 12, 2023

(30) Foreign Application Priority Data
Mar. 22, 2022    (KR) .................. 10-2022-0035547

(51) Int. Cl.
*H01L 25/00*    (2006.01)
*H01L 23/00*    (2006.01)
*H01L 25/065*    (2023.01)
*H01L 25/18*    (2023.01)

(52) U.S. Cl.
CPC .............. *H01L 24/08* (2013.01); *H01L 24/80* (2013.01); *H01L 25/0657* (2013.01); *H01L 25/18* (2013.01); *H01L 25/50* (2013.01); *H01L 2224/08145* (2013.01); *H01L 2224/80006* (2013.01); *H01L 2224/80895* (2013.01); *H01L 2224/80896* (2013.01); *H01L 2924/1431* (2013.01); *H01L 2924/14511* (2013.01)

(58) Field of Classification Search
CPC ...... H01L 24/08; H01L 24/80; H01L 25/0657
See application file for complete search history.

(56) References Cited

U.S. PATENT DOCUMENTS

| 10,727,244 | B2* | 7/2020 | Hwang | .................. H10B 43/35 |
| 2018/0358370 | A1* | 12/2018 | Hwang | .................. H10B 43/40 |
| 2018/0358371 | A1* | 12/2018 | Hwang | .............. H01L 25/0657 |
| 2019/0043836 | A1 | 2/2019 | Fastow et al. | |
| 2019/0326315 | A1* | 10/2019 | Lee | ...................... H10D 62/292 |
| 2020/0176058 | A1 | 6/2020 | Huo et al. | |
| 2023/0180468 | A1* | 6/2023 | Lee | .......................... H01L 24/06 |
| 2023/0282598 | A1* | 9/2023 | Oh | ............................ H01L 25/18 |
| 2024/0304602 | A1* | 9/2024 | Sanuki | .................. H10B 41/40 |

\* cited by examiner

*Primary Examiner* — Thao P Le
(74) *Attorney, Agent, or Firm* — WILLIAM PARK & ASSOCIATES LTD.

(57) ABSTRACT

The present disclosure provides a semiconductor memory device. The semiconductor memory device includes a peripheral circuit structure on a semiconductor substrate, a conductive line connected to the peripheral circuit structure, a peripheral circuit side bonding conductive pattern connected to the conductive line, a peripheral circuit side auxiliary bonding conductive pattern spaced apart from the peripheral circuit side bonding conductive pattern, a cell array side bonding conductive pattern contacting the peripheral circuit side bonding conductive pattern, a cell array side auxiliary bonding conductive pattern contacting the peripheral circuit side auxiliary bonding conductive pattern, and a memory cell array connected to the cell array side bonding conductive pattern.

13 Claims, 25 Drawing Sheets

SEMICONDUCTOR MEMORY DEVICE

CROSS-REFERENCE TO RELATED APPLICATION

The present application claims priority under 35 U.S.C. § 119(a) to Korean patent application number 10-2022-0035547, filed on Mar. 22, 2022, in the Korean Intellectual Property Office, the entire disclosure of which is incorporated herein by reference.

BACKGROUND

1. Technical Field

Various embodiments of the present disclosure relate to a semiconductor memory device, and more particularly, to a semiconductor memory device including a bonding structure.

2. Related Art

A semiconductor memory device may include a memory cell array and a peripheral circuit structure. The memory cell array may include a plurality of memory cells capable of storing data. The peripheral circuit structure may control various operations of the memory cell array including the memory cells.

The memory cell array and the peripheral circuit structure may be separately manufactured and electrically connected to each other through a bonding structure.

SUMMARY

According to an embodiment of the present disclosure, a semiconductor memory device may include a peripheral circuit structure disposed in a semiconductor substrate and a first array layer over the semiconductor substrate, a conductive line disposed in a second array layer over the first array layer and connected to the peripheral circuit structure, a peripheral circuit side bonding conductive pattern disposed in a third array layer over the second array layer and connected to the conductive line, a peripheral circuit side auxiliary bonding conductive pattern disposed in the third array layer and spaced apart from the peripheral circuit side bonding conductive pattern, a cell array side bonding conductive pattern disposed in a fourth array layer over the third array layer and contacting the peripheral circuit side bonding conductive pattern, a cell array side auxiliary bonding conductive pattern disposed in the fourth array layer and contacting the peripheral circuit side auxiliary bonding conductive pattern, and a memory cell array disposed over the fourth array layer and connected to the cell array side bonding conductive pattern.

According to an embodiment of the present disclosure, a semiconductor memory device may include a semiconductor substrate having an upper surface, the upper surface extending in a horizontal direction and facing a vertical direction, a memory cell array including a gate stack including a plurality of conductive patterns spaced apart from each other in the vertical direction and stacked over the semiconductor substrate, a channel structure extending to pass through the plurality of conductive patterns, and a memory layer between the channel structure and the gate stack, a plurality of peripheral circuit side bonding conductive patterns and a plurality of peripheral circuit side auxiliary bonding conductive patterns spaced apart from each other in a first bonding array layer between the memory cell array and the semiconductor substrate, a plurality of cell array side bonding conductive patterns and a plurality of cell array side auxiliary bonding conductive patterns spaced apart from each other in a second bonding array layer between the first bonding array layer and the memory cell array, and a plurality of conductive lines disposed between the first bonding array layer and the semiconductor substrate and respectively connected to the plurality of peripheral circuit side bonding conductive patterns.

DETAILED DESCRIPTION

Specific structural or functional descriptions disclosed below are exemplified to describe an embodiment according to the concept of the present disclosure. The embodiment according to the concept of the present disclosure is not construed as being limited to the embodiments described below, and may be variously modified and replaced with other equivalent embodiments.

Hereinafter, terms such as first and second may be used to describe various components, but the components are not limited by the terms. The terms are used for the purpose of distinguishing one component from another component, and an order or the number of components is not limited by the terms. It will be understood that when an element or layer etc., is referred to as being "on," "connected to" or "coupled to" another element or layer etc., it can be directly on, connected or coupled to the other element or layer etc., or intervening elements or layers etc., may be present. In contrast, when an element or layer etc., is referred to as being "directly on," "directly connected to" 'in direct contact with' or "directly coupled to" another element or layer etc., there are no intervening elements or layers etc., present.

Various embodiments of the present disclosure may provide a semiconductor memory device capable of improving stability of a bonding structure.

Figure 1:
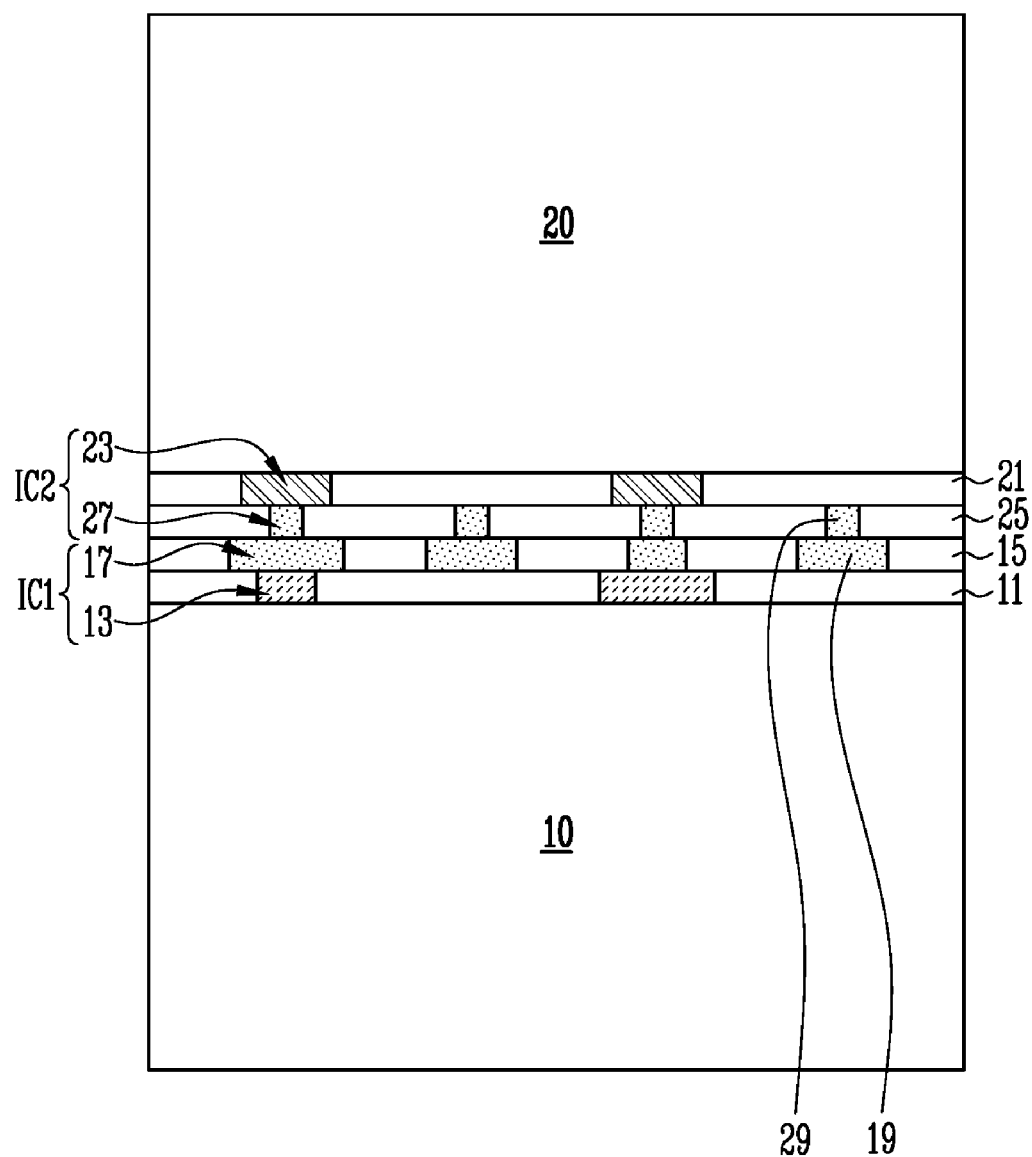
FIG. 1 schematically illustrates a semiconductor memory device according to an embodiment of the present disclosure.

FIG. 1 schematically illustrates a semiconductor memory device according to an embodiment of the present disclosure.

Referring to FIG. 1, the semiconductor memory device may include a first circuit structure 10 and a second circuit structure 20 overlapping the first circuit structure 10. One of the first circuit structure 10 and the second circuit structure 20 may configure a first memory cell array, and the other may configure a second memory cell array or a peripheral circuit structure. Each of the first memory cell array and the second memory cell array may include memory cells capable of storing data. Each memory cell may be configured in various structures. As an embodiment, each memory cell may be a non-volatile memory cell such as a NAND flash memory cell. The peripheral circuit structure may include a plurality of transistors for controlling an operation of the memory cells.

The semiconductor memory device may include a first insulating layer 11, a first bonding insulating layer 15, a second bonding insulating layer 25, and a second insulating layer 21. The first insulating layer 11, the first bonding insulating layer 15, the second bonding insulating layer 25, and the second insulating layer 21 may disposed between the first circuit structure 10 and the second circuit structure 20. The first insulating layer 11 may be disposed between the first circuit structure 10 and the first bonding insulating layer 15. The second bonding insulating layer 25 may be disposed between the first bonding insulating layer 15 and the second circuit structure 20. The second insulating layer 21 may be disposed between the second bonding insulating layer 25 and the second circuit structure 20.

The first circuit structure 10 and the second circuit structure 20 may be electrically connected to each other through a plurality of interconnections IC1 and IC2. The plurality of interconnections IC1 and IC2 may include a first circuit side interconnection IC1 and a second circuit side interconnection IC2 bonded to each other. The first circuit side interconnection IC1 may be electrically connected to the first circuit structure 10, and the second circuit side interconnection IC2 may be electrically connected to the second circuit structure 20.

The first circuit side interconnection IC1 may include a first circuit side conductive pattern 13 passing through the first insulating layer 11 and a first bonding conductive pattern 17 passing through the first bonding insulating layer 15. The first bonding conductive pattern 17 may pass through a portion of the first bonding insulating layer 15 overlapping the first circuit side conductive pattern 13. The first bonding conductive pattern 17 may be connected to a surface of the first circuit side conductive pattern 13 facing the second circuit structure 20. The first bonding conductive pattern 17 may form a bonding surface.

The second circuit side interconnection IC2 may include a second circuit side conductive pattern 23 passing through the second insulating layer 21 and a second bonding conductive pattern 27 passing through the second bonding insulating layer 25. The second bonding conductive pattern 27 may pass through the second bonding insulating layer 25. The second bonding conductive pattern 27 may contact the first bonding conductive pattern 17. The second bonding conductive pattern 27 may be connected to a surface of the second circuit side conductive pattern 23 facing the first circuit structure 10. The second bonding conductive pattern 27 may form a bonding surface.

At least one of the first bonding conductive pattern 17 and the second bonding pattern 27 may form a line of a circuit structure as well as a bonding surface.

The semiconductor memory device may include a first auxiliary bonding conductive pattern 19 and a second auxiliary bonding conductive pattern 29. The first auxiliary bonding conductive pattern 19 may pass through a portion of the first bonding insulating layer 15 that does not overlap the first circuit side conductive pattern 13. The first auxiliary bonding conductive pattern 19 may be spaced apart from the first bonding conductive pattern 17 by the first bonding insulating layer 15. The second auxiliary bonding conductive pattern 29 may pass through a portion of the second bonding insulating layer 25 that does not overlap the second circuit side conductive pattern 23. The second auxiliary bonding conductive pattern 29 may be spaced apart from the second bonding conductive pattern 27 by the second bonding insulating layer 25. The second auxiliary bonding conductive pattern 29 may be in contact with the first auxiliary bonding conductive pattern 19.

Each of the first bonding insulating layer 15 and the second bonding insulating layer 25 may include silicon oxide, silicon oxynitride, silicon carbonitride, or the like. The first bonding conductive pattern 17, the second bonding conductive pattern 27, the first auxiliary bonding conductive pattern 19, and the second auxiliary bonding conductive pattern 29 may include copper, a copper alloy, or the same type of metal. The first circuit structure 10 and the second circuit structure 20 may be connected to each other by a bonding structure. The bonding structure may be defined by bonding between the first auxiliary bonding conductive pattern 19 and the second auxiliary bonding conductive pattern 29 as well as bonding between the first bonding insulating layer 15 and the second bonding insulating layer 25, and bonding between the first bonding conductive pattern 17 and the second bonding conductive pattern 27. The first auxiliary bonding conductive pattern 19 and the second auxiliary bonding conductive pattern 29 may be disposed in an area where the first bonding conductive pattern 17 and the second bonding conductive pattern 27 are not disposed. In an embodiment, the first auxiliary bonding conductive pattern 19 and the second auxiliary bonding conductive pattern 29 may be in contact with each other, thereby reducing a bonding area between an insulating material and a metal. Accordingly, in an embodiment, because bonding between an insulating material and a metal, which has a bonding strength relatively weaker than that of bonding between metals, stability of the bonding structure may be improved. In an embodiment, at least one of the first bonding conductive pattern 17 and the second bonding conductive pattern 27 may be bonded to each other to form a bonding surface and may be used as a line of a circuit structure, thereby simplifying a structure and manufacturing process of the semiconductor memory device.

Hereinafter, embodiments of the present disclosure are described by using a semiconductor memory device including a peripheral circuit structure of a three-dimensional NAND flash memory element and a memory cell array as an example.

Figure 2:
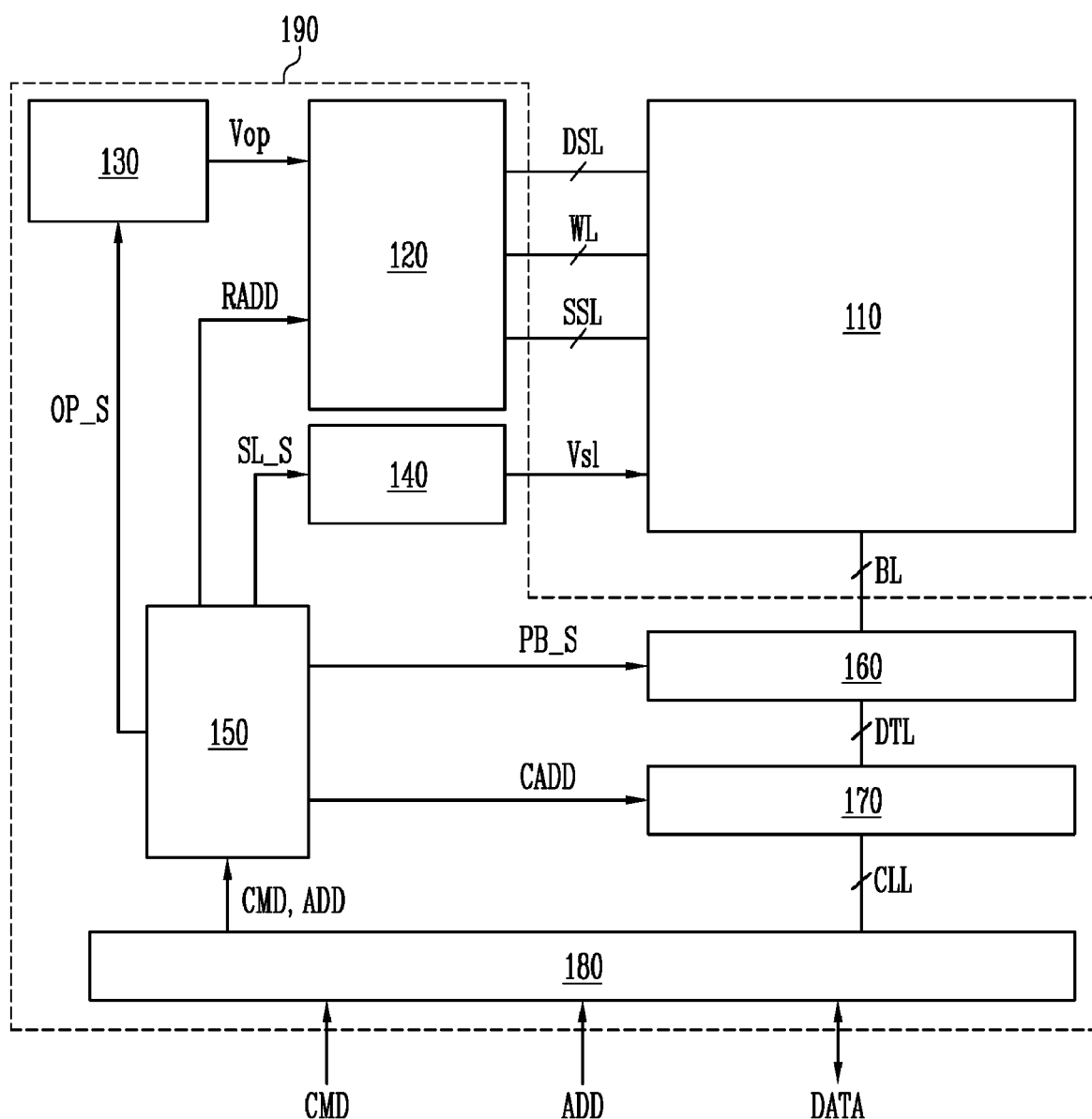
FIG. 2 is a block diagram illustrating a semiconductor memory device according to an embodiment of the present disclosure.

FIG. 2 is a block diagram illustrating a semiconductor memory device according to an embodiment of the present disclosure.

Referring to FIG. 2, the semiconductor memory device 100 may include a peripheral circuit structure 190 and a memory cell array 110.

The peripheral circuit structure 190 may be configured to perform a program operation and a verify operation for storing data in the memory cell array 110, a read operation for outputting the data stored in the memory cell array 110, and an erase operation for erasing the data stored in the memory cell array 110. The peripheral circuit structure 190 may include an input/output circuit 180, a control circuit 150, a voltage generation circuit 130, a row decoder 120, a column decoder 170, a page buffer 160, and a source line driver 140.

The memory cell array 110 may include a plurality of memory cells in which data is stored. As an embodiment, the memory cell array 110 may include a three-dimensional memory cell array. The plurality of memory cells may store data of a single-bit or multi-bit of two or more bits for each cell. The plurality of memory cells may configure a plurality of memory cell strings. Each memory cell string may include a plurality of memory cells connected in series through a channel layer. The channel layer may be connected to the page buffer 160 through a corresponding bit line BL among a plurality of bit lines BL.

The input/output circuit 180 may transmit a command CMD and an address ADD received from an external device (for example, a memory controller) of the semiconductor memory device 100 to the control circuit 150. The input/output circuit 180 may exchange data DATA with an external device and the column decoder 170.

In response to the command CMD and the address ADD, the control circuit 150 may output an operation signal OP_S, a row address RADD, a source line control signal SL_S, a page buffer control signal PB_S, and a column address CADD.

The voltage generation circuit 130 may generate various operation voltages Vop used for the program operation, the verify operation, the read operation, and the erase operation in response to the operation signal OP_S.

The row decoder 120 may be connected to the memory cell array 110 through a plurality of drain select lines DSL, a plurality of word lines WL, and a plurality of source select lines SSL. The row decoder 120 may transmit the operation voltages Vop to the plurality of drain select lines DSL, the plurality of word lines WL, and the plurality of source select lines SSL in response to the row address RADD.

In response to the column address CADD, the column decoder 170 may transmit the data DATA input from the input/output circuit 180 to the page buffer 160, or transmit the data DATA stored in the page buffer 160 to the input/output circuit 180. The column decoder 170 may exchange the data DATA with the input/output circuit 180 through column lines CLL. The column decoder 170 may exchange the data DATA with the page buffer 160 through data lines DTL.

The page buffer 160 may be connected to the memory cell array 110 through the bit line BL. The page buffer 160 may temporarily store the data DATA received through the plurality of bit lines BL in response to the page buffer control signal PB_S. The page buffer 160 may sense a voltage or a current of the plurality of bit lines BL during the read operation.

The source line driver 140 may transmit a source voltage Vsl supplied from the source line driver 140 to the memory cell array 110 in response to the source line control signal SL_S.

Figure 3:
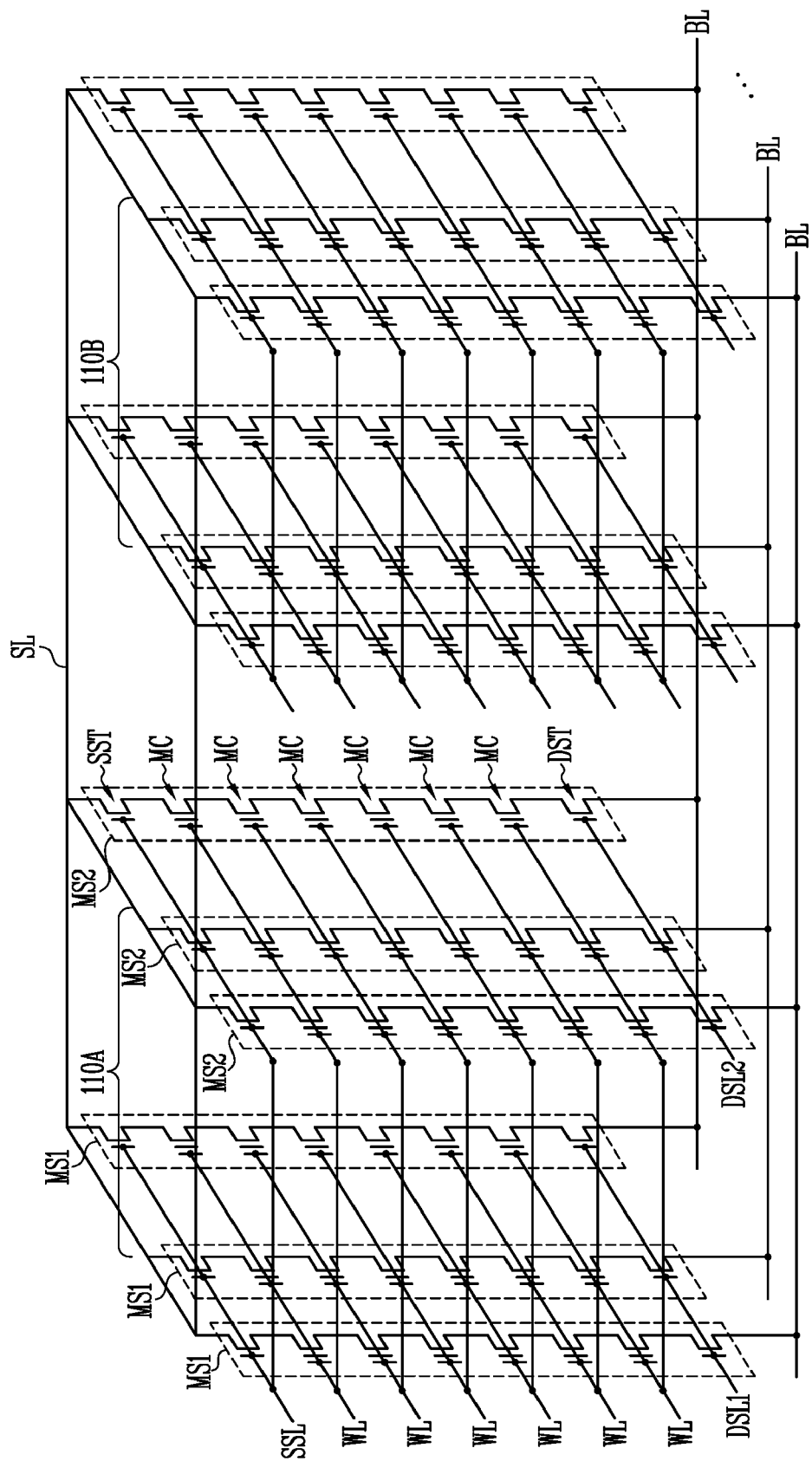
FIG. 3 is a circuit diagram illustrating an embodiment of a memory cell array shown in FIG. 2.

FIG. 3 is a circuit diagram illustrating an embodiment of the memory cell array shown in FIG. 2.

Referring to FIG. 3, the memory cell array 110 shown in FIG. 2 may include a first memory cell array 110A and a second memory cell array 110B. Each of the first memory cell array 110A and the second memory cell array 110B may include a plurality of memory cell strings MS1 and MS2 connected to a source layer SL and a plurality of bit lines BL.

Each memory cell string MS1 or MS2 may include a plurality of memory cells MC connected in series, at least one source select transistor SST, and at least one drain select transistor DST. As an embodiment, each memory cell string MS1 or MS2 may include one source select transistor SST connected between the plurality of memory cells MC and the source layer SL. As another embodiment, each memory cell string MS1 or MS2 may include two or more source select transistors SST connected in series between the plurality of memory cells MC and the source layer CSL. As an embodiment, each memory cell string MS1 or MS2 may include one drain select transistor DST connected between the plurality of memory cells MC and the bit line BL. As another embodiment, each memory cell string MS1 or MS2 may include two or more drain select transistors DST connected in series between the plurality of memory cells MC and the bit line BL.

The plurality of memory cells MC may be connected to the source layer SL via the source select transistor SST. The plurality of memory cells MC may be connected to the bit line BL via the drain select transistor DST.

The plurality of memory cell strings MS1 and MS2 may include a first memory cell string MS1 and a second memory cell string MS2.

The first memory cell string MS1 may be connected to a first drain select line DSL1, and the second memory cell string MS2 may be connected to a second drain select line DSL2. The first drain select line DSL1 may be used as a gate of the drain select transistor DST in the first memory cell string MS1. The second drain select line DSL2 may be used as a gate of the drain select transistor DST in the second memory cell string MS2.

The first memory cell string MS1 and the second memory cell string MS2 may be connected to a plurality of word lines WL. The plurality of word lines WL may be used as a plurality of gates of the plurality of memory cells MC configuring each of the first memory cell string MS1 and the second memory cell string MS2.

The first memory cell string MS1 and the second memory cell string MS2 may be connected to the source select line SSL. The source select line SSL may be used as a gate of the source select transistor SST in each of the first memory cell string MS1 and the second memory cell string MS2.

The first memory cell string MS1 and the second memory cell string MS2 commonly connected to each word line WL may be individually separated by the first drain select line DSL1 and the second drain select line DSL2.

Figure 4:
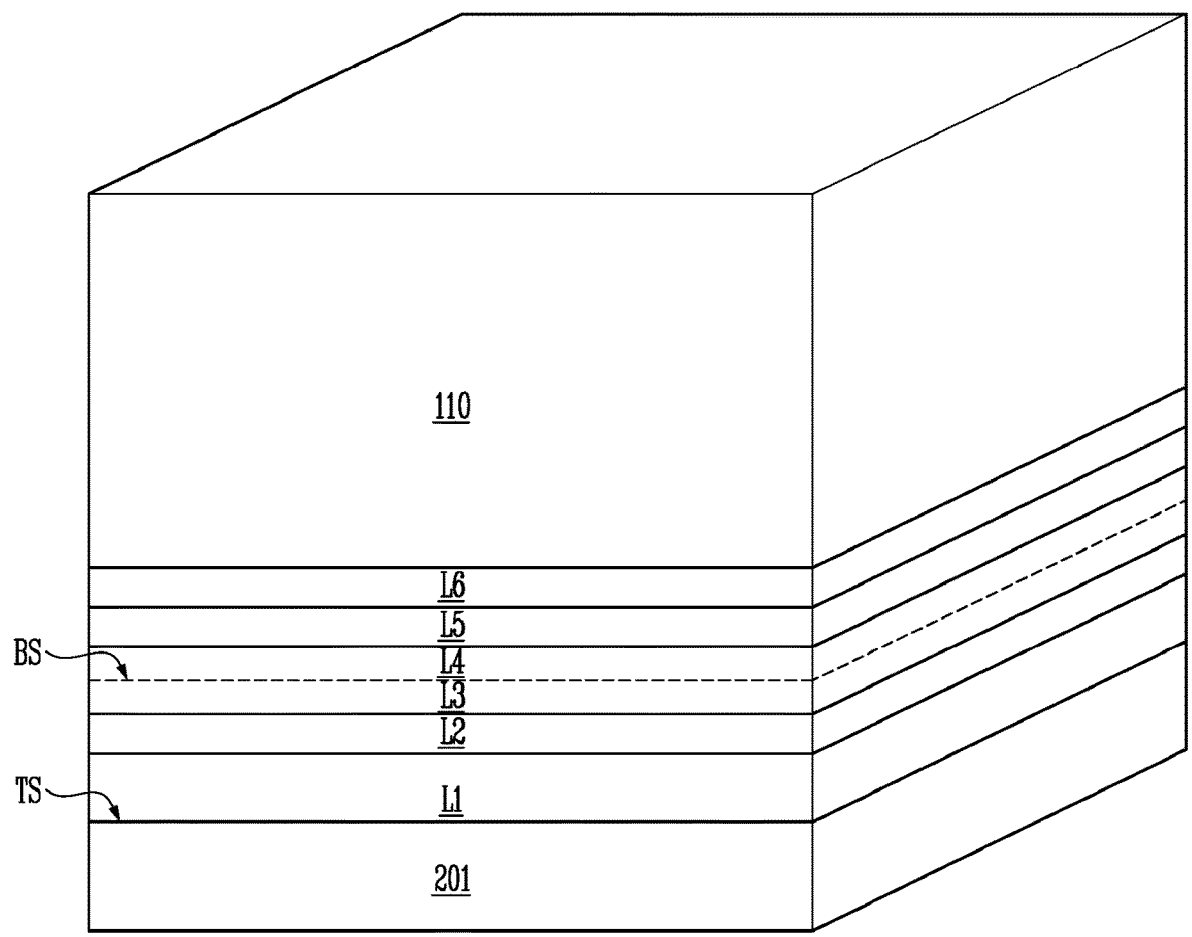
FIG. 4 illustrates a schematic arrangement of a semiconductor memory device according to an embodiment of the present disclosure.

FIG. 4 illustrates a schematic arrangement of a semiconductor memory device according to an embodiment of the present disclosure.

Referring to FIG. 4, the semiconductor memory device may include a semiconductor substrate 201 having an upper surface TS. The upper surface TS of the semiconductor substrate 201 may extend in a horizontal direction and may face a vertical direction. Hereinafter, the horizontal direction may be defined as a first direction D1 and a second direction D2 in which axes crossing each other face, and the vertical direction may be defined as a third direction D3. As an embodiment, the first direction D1, the second direction D2, and the third direction D3 may correspond to directions in which an X-axis, a Y-axis, and a Z-axis of an XYZ coordinate system face, respectively.

The semiconductor memory device may include a first array layer L1, a second array layer L2, a third array layer L3, a fourth array layer L4, a fifth array layer L5, a sixth array layer L6, and a memory cell array 110 arranged in the third direction D3 on the semiconductor substrate 201.

The peripheral circuit structure 190 shown in FIG. 2 may include a plurality of transistors. The plurality of transistors of the peripheral circuit structure 190 may be formed in the first semiconductor substrate 201 and the first array layer L1. A plurality of configurations for electrically connecting the peripheral circuit structure 190 and the memory cell array 110 may be disposed in the first array layer L1, the second array layer L2, the third array layer L3, the fourth array layer L4, the fifth array layer L5, and the sixth array layer L6. The third array layer L3 and the fourth array layer L4 between the second array layer L2 and the fifth array layer L5 may include a plurality of configurations for a bonding structure. The third array layer L3 may be defined as a first bonding array layer, and the fourth array layer L4 may be defined as a second bonding array layer. The configuration of the third array layer L3 and the configuration of the fourth array layer L4 may form a bonding surface BS.

Figure 5A:
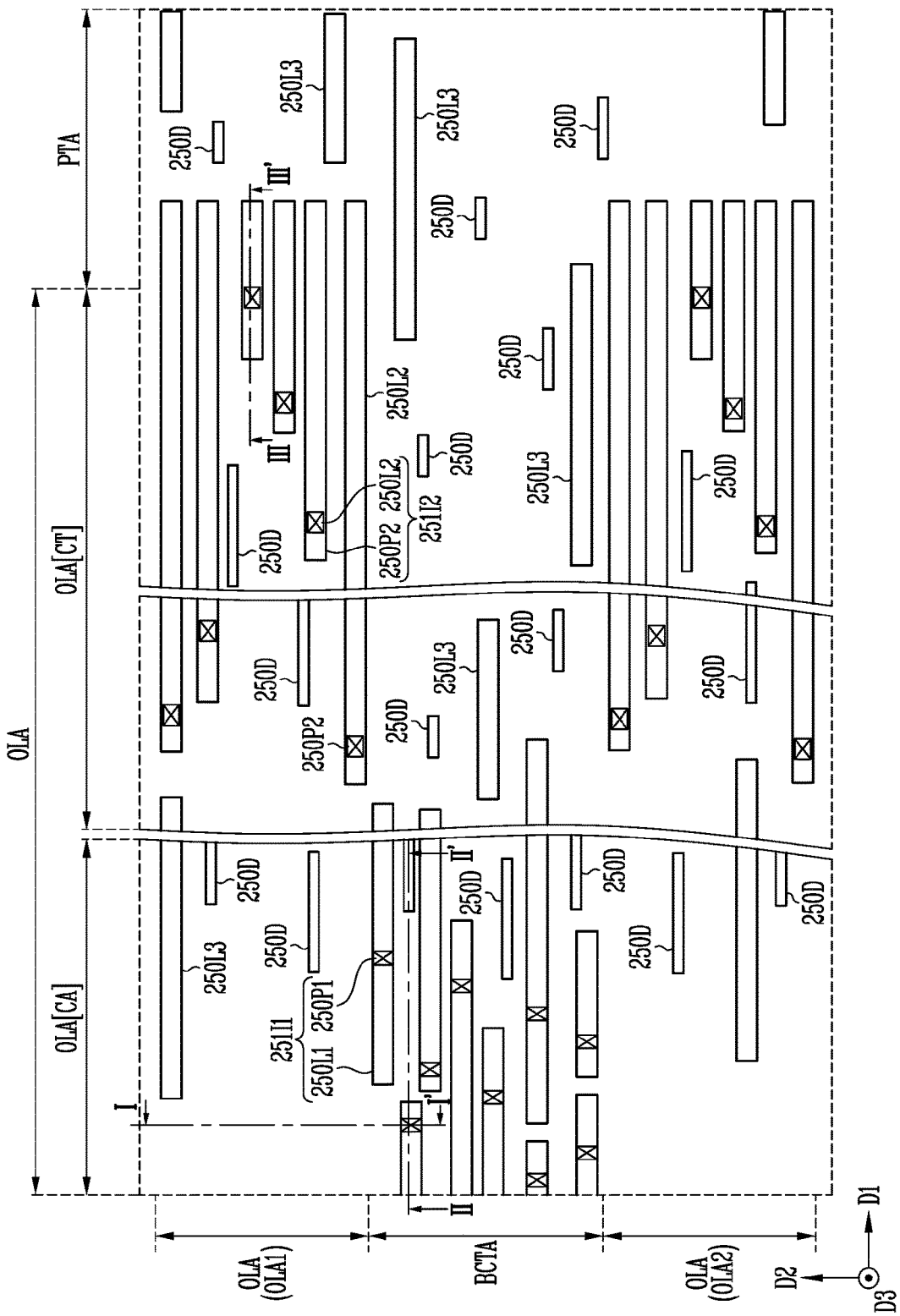
FIGS. 5A, 5B, and 5C are plan views illustrating a semiconductor memory device according to an embodiment of the present disclosure.
Figure 5B:
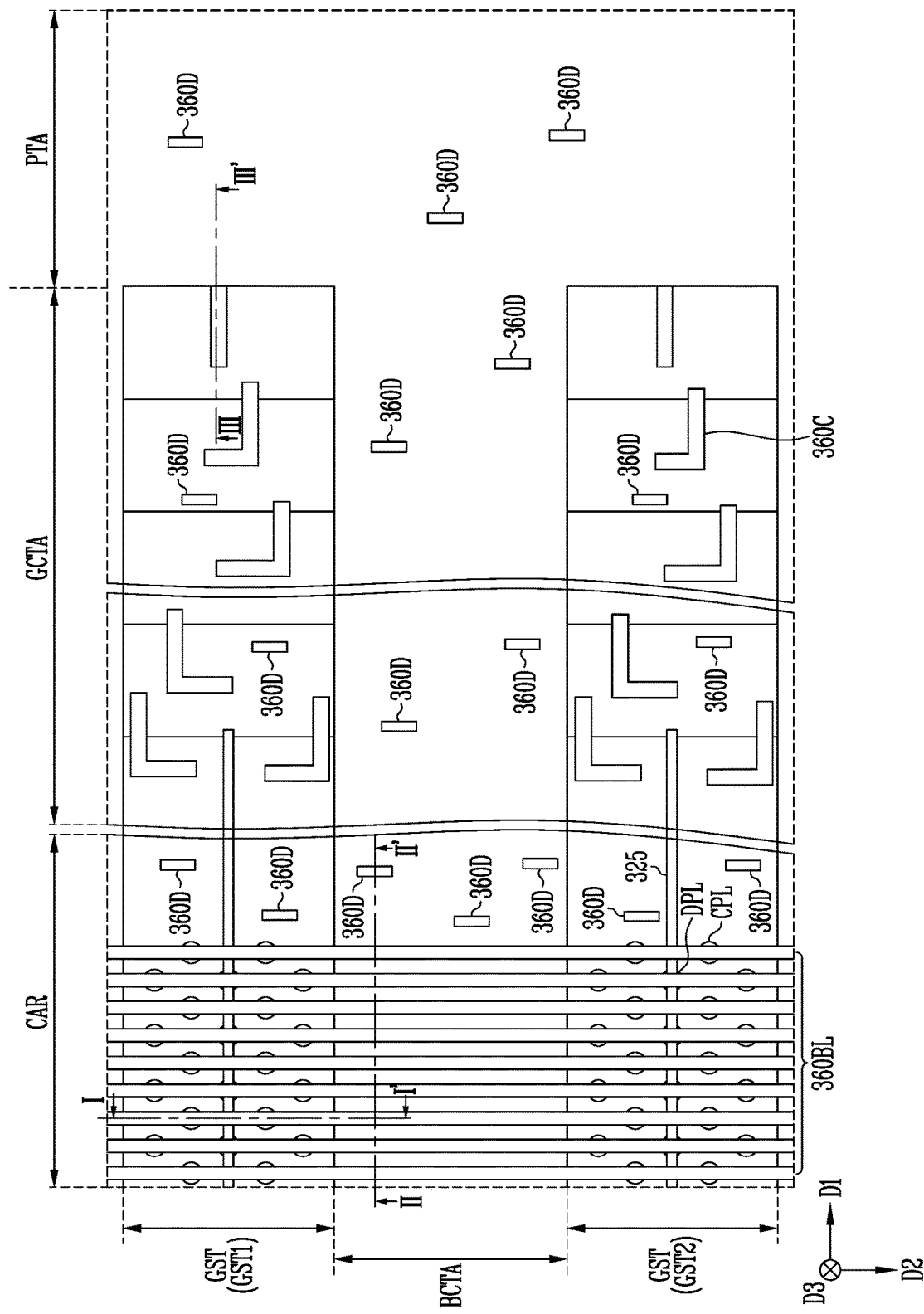
Figure 5C:
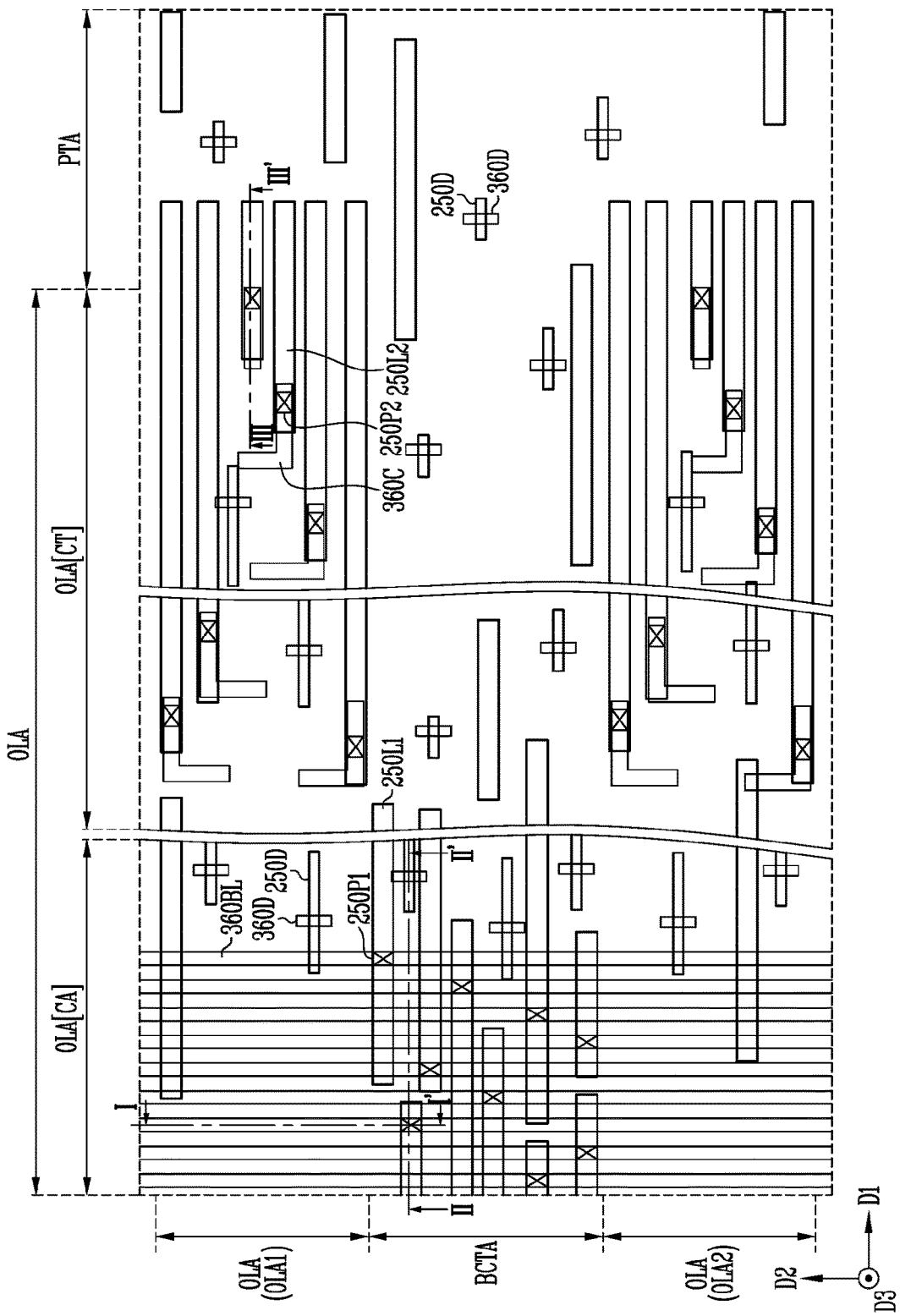

FIGS. 5A, 5B, and 5C are plan views illustrating a semiconductor memory device according to an embodiment of the present disclosure.

FIG. 5A illustrates some configurations of each of the second array layer L2 and the third array layer L3 shown in FIG. 4.

Figure 6A:
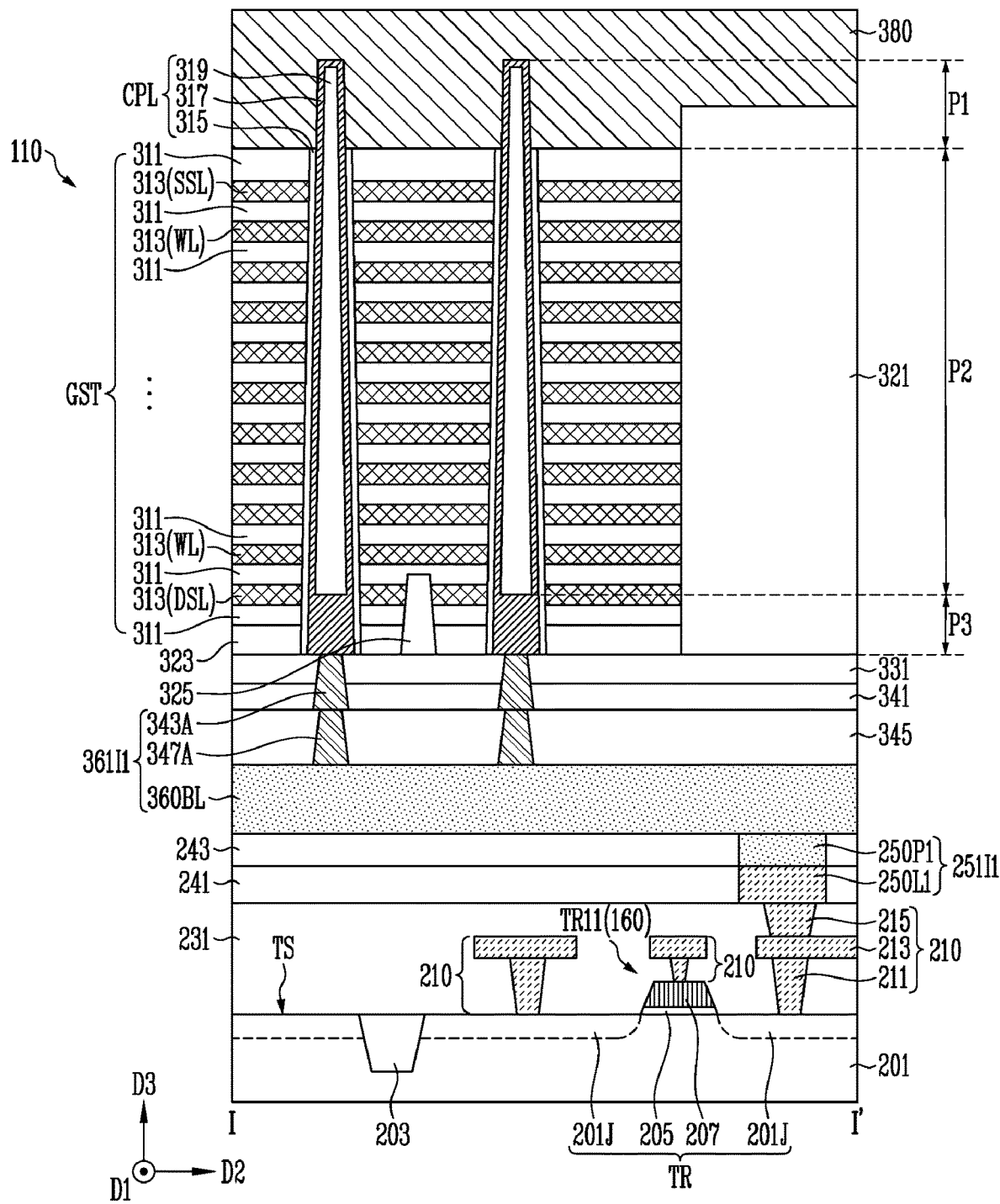
FIGS. 6A, 6B, and 6C are cross-sectional views illustrating a semiconductor memory device according to an embodiment of the present disclosure.
Figure 6B:
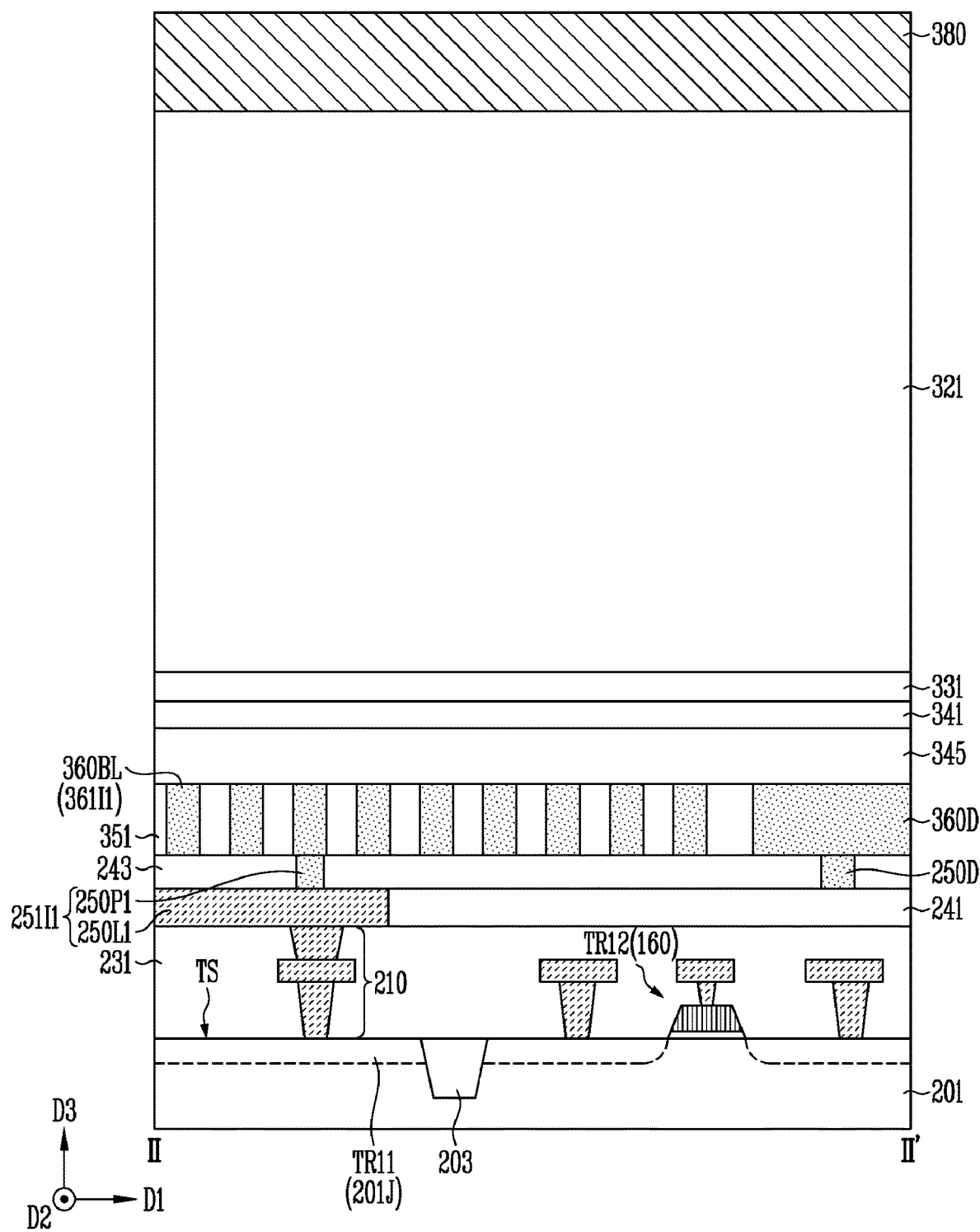
Figure 6C:
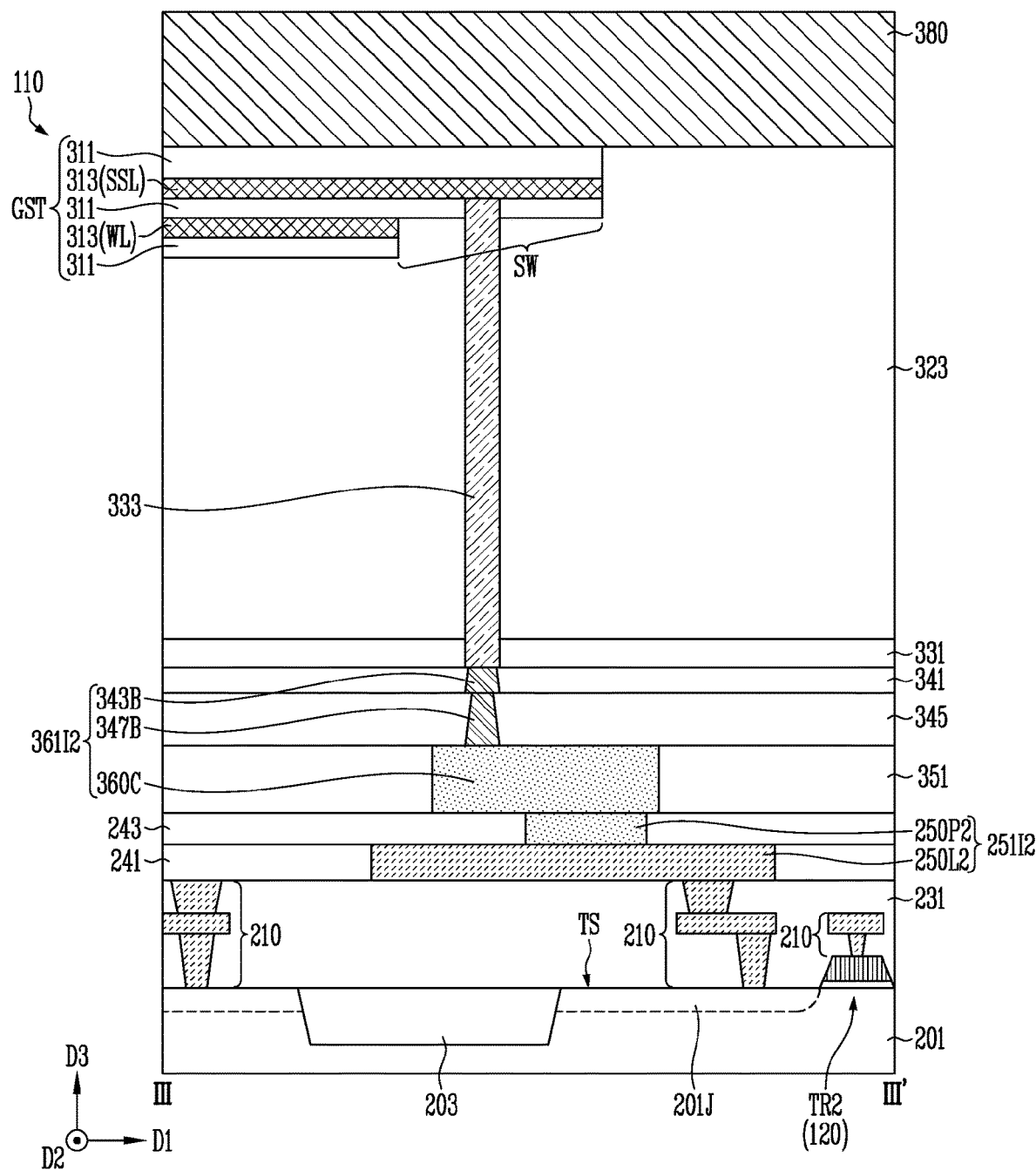

Referring to FIGS. 4 and 5A, the second array layer L2 may be disposed over the first array layer L1. A plurality of conductive lines 250L1, 250L2, and 250L3 may be disposed in the second array layer L2. The plurality of conductive lines 250L1, 250L2, and 250L3 may be electrically connected to the peripheral circuit structure 190 shown in FIG. 2 via a plurality of lower interconnections 210 disposed in the first array layer L1 as shown in FIGS. 6A, 6B and 6C. The plurality of conductive lines 250L1, 250L2, and 250L3 may be spaced apart from each other in the first direction D1 and the second direction D2 in the second array layer L2. The plurality of conductive lines 250L1, 250L2, and 250L3 may include a plurality of first conductive lines 250L1 connected to the page buffer 160 shown in FIG. 2, a plurality of second conductive lines 250L2 connected to the row decoder 120 shown in FIG. 2, and a plurality of third conductive lines 250L3 connected to at least one of remaining configurations of the peripheral circuit structure 190 excluding the page buffer 160 and the row decoder 120.

The semiconductor substrate 201 may include a plurality of gate overlapping areas OLA, a bit line contact area BCTA, and a pass transistor area PTA that are spaced apart from each other. The bit line contact area BCTA may extend in the first direction D1. The plurality of gate overlapping areas OLA may include a first gate overlapping area OLA1 and a second gate overlapping area OLA2 that are spaced apart in the second direction D2. The bit line contact area BCTA may be disposed between the first gate overlapping area OLA1 and the second gate overlapping area OLA2. The pass transistor area PTA may be disposed adjacent to one side of the second gate overlapping area OLA2, and may extend in the second direction D2 to be adjacent to the bit line contact area BCTA and the first gate overlapping area OLA1. Each of the first gate overlapping area OLA1 and the second gate overlapping area OLA2 may include a cell array overlapping area OLA[CA] and a gate contact overlapping area OLA[CT]. The gate contact overlapping area OLA[CT] may extend from the cell array overlapping area OLA[CA] toward the pass transistor area PTA.

The plurality of first conductive lines 250L1 may overlap the bit line contact area BCTA of the semiconductor substrate 201. The plurality of second conductive lines 250L2 may overlap the gate contact overlapping area OLA[CT] of the semiconductor substrate 201 and may extend toward the pass transistor area PTA. The plurality of third conductive lines 250L3 may be disposed to be spaced apart from each other at a position spaced apart from the plurality of first conductive lines 250L1 and the plurality of second conductive lines 250L2.

A plurality of peripheral circuit side bonding conductive patterns 250P1 and 250P2 and a plurality of peripheral circuit side auxiliary bonding conductive patterns 250D may be disposed in the third array layer L3 over the second array layer L2. The plurality of peripheral circuit side bonding conductive patterns 250P1 and 250P2 and the plurality of peripheral circuit side auxiliary bonding conductive patterns 250D may be spaced apart from each other. The plurality of peripheral circuit side bonding conductive patterns 250P1 and 250P2 may include a plurality of first peripheral circuit side bonding conductive patterns 250P1 and a plurality of second peripheral circuit side bonding conductive patterns 250P2.

The plurality of first peripheral circuit side bonding conductive patterns 250P1 may be respectively connected to the plurality of first conductive lines 250L1. Hereinafter, the first peripheral circuit side bonding conductive pattern 250P1 and the first conductive line 250L1 connected to each other are defined as a first peripheral circuit side interconnection 25I11.

The plurality of second peripheral circuit side bonding conductive patterns 250P2 may be respectively connected to the plurality of second conductive lines 250L2. Hereinafter, the second peripheral circuit side bonding conductive pattern 250P2 and the second conductive line 250L2 connected to each other are defined as a second peripheral circuit side interconnection 25I12.

The plurality of peripheral circuit side auxiliary bonding conductive patterns 250D may be spaced apart from the plurality of first conductive lines 250L1, the plurality of second conductive lines 250L2, and the plurality of third conductive lines 250L3. The plurality of peripheral circuit side auxiliary bonding conductive patterns 250D may be a configuration that is not involved in an operation of the semiconductor memory device. Differently from an embodiment of the present disclosure, the plurality of peripheral circuit side auxiliary bonding conductive patterns 250D may be omitted in the third array layer L3. In this case, the difference in the pattern density throughout different areas in the third array layer L3 is increased compared to an embodiment of the present disclosure including the plurality of peripheral circuit side auxiliary bonding conductive patterns 250D. In contrast, when the plurality of peripheral circuit side auxiliary bonding conductive patterns 250D are additionally disposed in addition to the plurality of first peripheral circuit side bonding conductive patterns 250P1 and the plurality of second peripheral circuit side bonding conductive patterns 250P2 in the third array layer L3, the difference in the pattern density throughout different areas in the third array layer L3 may be reduced. In an embodiment, as the difference in the pattern density throughout different areas is reduced, stability of a process may be improved while manufacturing the semiconductor memory device.

FIG. 5B illustrates some configurations of each of the fourth array layer L4 and the memory cell array 110 shown in FIG. 4.

Referring to FIGS. 4 and 5B, the memory cell array 110 may include a plurality of gate stacks GST over the fourth array layer L4 and a plurality of cell plugs CPL passing through each of the gate stacks GST. A select line isolation layer 325 may be buried in each of the gate stacks GST. Each of the gate stacks GST may be penetrated by a plurality of dummy plugs DPL. An embodiment of the present disclosure is not limited thereto, and the plurality of dummy plugs DPL may be omitted.

The plurality of gate stacks GST may include a first gate stack GST1 and a second gate stack GST2 spaced apart from each other in the second direction D2. The first gate stack GST1 may overlap the first gate overlapping area OLA1 of the semiconductor substrate 201 described with reference to FIG. 5A. The second gate stack GST2 may overlap the second gate overlapping area OLA2 of the semiconductor substrate 201 described with reference to FIG. 5A.

The first gate stack GST1 and the second gate stack GST2 may be disposed on both sides of the bit line contact area BCTA of the semiconductor substrate 201. Each of the first gate stack GST1 and the second gate stack GST2 may include a cell array area CAR and a gate contact area GCTA. The cell array area CAR may correspond to the cell array overlapping area OLA[CA] of the semiconductor substrate 201 described with reference to FIG. 5A. The gate contact area GCTA may correspond to the gate contact overlapping area OLA[CT] of the semiconductor substrate 201 described with reference to FIG. 5A.

The plurality of cell plugs CPL and the plurality of dummy plugs DPL may pass through the cell array area CAR of each of the first gate stack GST1 and the second gate stack GST2. The plurality of cell plugs CPL may be disposed on both sides of the select line isolation layer 325. The plurality of dummy plugs DPL may overlap the select line isolation layer 325 and may be arranged in a line along an extension direction of the select isolation layer 325. As an embodiment, the select line isolation layer 325 may extend in the first direction D1, and the plurality of dummy plugs DPL may be arranged in a line along the first direction D1.

The gate contact area GCTA of each of the first gate stack GST1 and the second gate stack GST2 may be formed in a step shape structure. Each of the first gate stack GST1 and the second gate stack GST2 may include a plurality of conductive patterns 313 stacked apart from each other in the third direction D3 as shown in FIGS. 6A and 6C.

A plurality of cell array side bonding conductive patterns 360BL and 360C may be electrically connected to the memory cell array 110. The plurality of cell array side bonding conductive patterns 360BL and 360C may be disposed in the fourth array layer L4. The plurality of cell array side bonding conductive patterns 360BL and 360C may include a plurality of bit lines 360BL and a plurality of connection patterns 360C spaced apart from each other.

The plurality of bit lines 360BL may overlap the plurality of cell plugs CPL. As an embodiment, each bit line 360BL may overlap the cell plugs CPL arranged in a row in the second direction D2. Each of the bit lines 360BL may be electrically connected to a channel structure (refer to 317 shown in FIG. 6A) of the cell plug CPL corresponding thereto.

The plurality of connection patterns 360C may overlap the gate contact area GCTA of each of the first gate stack GST1 and the second gate stack GST2. Each of the connection patterns 360C may be electrically connected to a conductive pattern (refer to 313 shown in FIG. 6C) corresponding thereto.

In addition to the plurality of cell array side bonding conductive patterns 360BL and 360C, a plurality of cell array side auxiliary bonding conductive patterns 360D may be disposed in the fourth array layer L4. The plurality of cell array side bonding conductive patterns 360BL and 360C and the plurality of cell array side auxiliary bonding conductive patterns 360D may be spaced apart from each other in the fourth array layer L4.

The plurality of cell array side auxiliary bonding conductive patterns 360D may be a configuration that is not involved in the operation of the semiconductor memory device. Differently from an embodiment of the present disclosure, the plurality of cell array side auxiliary bonding conductive patterns 360D may be omitted in the fourth array layer L4. An embodiment of the present disclosure may reduce a difference in the pattern density throughout different areas in the fourth array layer L4 compared to a case in which the plurality of cell array side auxiliary bonding conductive patterns 360D are omitted.

FIG. 5C illustrates an overlapping relationship between the configurations shown in FIG. 5A and the configurations shown in FIG. 5B.

Referring to FIG. 5C, the plurality of peripheral circuit side bonding conductive patterns 250P1 and 250P2 may correspond to the plurality of cell array side bonding conductive patterns 360BL and 360C, respectively. As an embodiment, the plurality of peripheral circuit side bonding conductive patterns 250P1 and 250P2 may overlap the plurality of cell array side bonding conductive patterns 360BL and 360C, respectively. The bit line 360BL among the plurality of cell array side bonding conductive patterns 360BL and 360C may be bonded to the first peripheral circuit side bonding conductive pattern 250P1 corresponding thereto to be connected to the first conductive line 250L1. The connection pattern 360C among the plurality of cell array side bonding conductive patterns 360BL and 360C may be bonded to the second peripheral circuit side bonding conductive pattern 250P2 corresponding thereto to be connected to the second conductive line 250L2.

The plurality of peripheral circuit side auxiliary bonding conductive patterns 250D may respectively correspond to the plurality of cell array side auxiliary bonding conductive patterns 360D. As an embodiment, the peripheral circuit side auxiliary bonding conductive patterns 250D may overlap the plurality of cell array side auxiliary bonding conductive patterns 360D, respectively. The plurality of peripheral circuit side auxiliary bonding conductive patterns 250D may be bonded to the plurality of cell array side auxiliary bonding conductive patterns 360D, respectively.

According to an embodiment of the present disclosure, the peripheral circuit structure and the memory cell array may be electrically connected and the peripheral circuit structure and the memory cell array may be structurally combined by bonding the plurality of cell array side bonding conductive patterns 360BL and 360C to the plurality of peripheral circuit side bonding conductive patterns 250P1 and 250P2. According to an embodiment of the present disclosure, because the plurality of cell array side bonding conductive patterns 360BL and 360C form a bonding surface and are used as lines connected to the memory cell array, a manufacturing process may be simplified compared to a case in which a pattern for a bonding surface and a pattern for a line are separately formed.

Each of the third array layer L3 and the fourth array layer L4 shown in FIG. 4 may include an extra area. The extra area of the third array layer L3 may be defined as an area which does not overlap the plurality of first conductive lines L1, the plurality of second conductive lines L2, and the plurality of third conductive lines L3 and in which the plurality of first peripheral circuit side bonding conductive patterns 250P1 and the plurality of second peripheral circuit side bonding conductive patterns 250P2 are not disposed. The plurality of peripheral circuit side auxiliary bonding conductive patterns 250D may be disposed in the extra area of the third array layer L3. The extra area of the fourth array layer L4 may be defined as an area in which the plurality of bit lines 360BL and the plurality of connection patterns 360C are not disposed. The plurality of cell array side auxiliary bonding conductive patterns 360D may be disposed in the extra area of the fourth array layer L4.

The plurality of cell array side auxiliary bonding conductive patterns 360D may overlap the plurality of peripheral circuit side auxiliary bonding conductive patterns 250D. The plurality of cell array side auxiliary bonding conductive patterns 360D may be bonded to the plurality of peripheral circuit side auxiliary bonding conductive patterns 250D. In an embodiment, a bonding structure may be defined by bonding between the plurality of cell array side auxiliary bonding conductive patterns 360D and the plurality of peripheral circuit side auxiliary bonding conductive patterns 250D as well as bonding the plurality of peripheral circuit side bonding conductive patterns 250P1 and 250P2 and the plurality of cell array side bonding conductive patterns 360BL and 360C, and bonding between a first bonding insulating layer 243 shown in FIGS. 6B and 6C and a second bonding insulating layer 351 shown in FIGS. 6B and 6C. According to an embodiment of the present disclosure, stability of the bonding structure may be improved by bonding between the plurality of cell array side auxiliary bonding conductive patterns 360D and the plurality of peripheral circuit side auxiliary bonding conductive patterns 250D that are not involved in the operation of the semiconductor memory device. The plurality of cell array side auxiliary bonding conductive patterns 360D may extend in a direction crossing the peripheral circuit side auxiliary bonding conductive patterns 250D. Accordingly, in an embodiment, an alignment margin between the plurality of cell array side auxiliary bonding conductive patterns 360D and the plurality of peripheral circuit side auxiliary bonding conductive patterns 250D may be improved. An embodiment of the present disclosure is not limited thereto, and the plurality of cell array side auxiliary bonding conductive patterns 360D may extend in the same direction as the peripheral circuit side auxiliary bonding conductive patterns 250D.

FIGS. 6A, 6B, and 6C are cross-sectional views illustrating a semiconductor memory device according to an embodiment of the present disclosure. FIG. 6A illustrates a cross-sectional view of the semiconductor memory device taken along a line I-I' shown in each of FIGS. 5A to 5C, FIG. 6B illustrates a cross-sectional view of the semiconductor memory device taken along a line II-II' shown in each of FIGS. 5A to 5C, and FIG. 6C illustrates a cross-sectional view of the semiconductor memory device taken along a line III-III' shown in each of FIGS. 5A to 5C.

Referring to FIGS. 4, 6A, 6B, and 6C, the peripheral circuit structure 190 shown in FIG. 2 may include a plurality of transistors TR. Each transistor TR may include a gate insulating layer 205, a gate electrode 207, and junctions 201J. The gate insulating layer 205 and the gate electrode 207 may be stacked on an active area of the semiconductor substrate 201. That is, the gate insulating layer 205 and the gate electrode 207 may be disposed in the first array layer L1. The active area of the semiconductor substrate 201 may be partitioned by an isolation layer 203 buried in the semiconductor substrate 201. The junctions 201J may be defined as an area in which at least one of an n-type impurity and a p-type impurity is implanted into the active area of the semiconductor substrate 201 at both sides of the gate electrode 207. The junctions 201J may be provided as a source area and a drain area of the transistor TR corresponding thereto. The plurality of transistors TR may include a plurality of first transistors TR11 and TR12 configuring the page buffer 160 and a plurality of second transistors TR2 configuring the row decoder 120. The plurality of first transistors TR11 and TR12 may overlap the bit line contact area BCTA of the semiconductor substrate 201 shown in FIGS. 5A to 5C. Each of the plurality of second transistors TR2 may be a pass transistor configured to transmit the operation signal OP_S supplied from the voltage generation circuit 130 shown in FIG. 2 to the memory cell array 110 in response to a block selection signal. The plurality of second transistors TR2 may overlap the pass transistor area PTA of the semiconductor substrate shown in FIGS. 5A to 5C.

A lower insulating structure 231 and a plurality of lower interconnections 210 may be disposed in the first array layer L1. The lower insulating structure 231 may include two or more insulating layers. The lower insulating structure 231 may cover the semiconductor substrate 201, the plurality of first transistors TR11 and TR12, and the plurality of second transistors TR2. The plurality of lower interconnections 210 may be disposed inside the lower insulating structure 231. The plurality of lower interconnections 210 may be connected to the plurality of first transistors TR11 and TR12 and the plurality of second transistors TR2.

Each lower interconnection 210 may include conductive patterns of two or more layers stacked in the third direction D3. As an embodiment, each lower interconnection 210 may include a first conductive pattern 211 connected to the junction 201J or the gate electrode 207, a second conductive pattern 213 on the first conductive pattern 211, and a third conductive pattern 215 on the second conductive pattern 213.

A first insulating layer 241 may be disposed in the second array layer L2. The first insulating layer 241 may extend to cover the lower insulating structure 231. The first insulating layer 241 may be penetrated by the first conductive line 250L1 and the second conductive line 250L2. In addition, the first insulating layer 241 may be penetrated by the third conductive line 250L3 shown in FIG. 5A.

The first conductive line 250L1 may be connected to the junction 201J of a first transistor (for example, TR11) corresponding thereto via a lower interconnection corresponding thereto among the plurality of lower interconnections 210. The second conductive line 250L2 may be connected to the junction 201J of the second transistor TR2 corresponding thereto via a lower interconnection 210 corresponding thereto among the plurality of lower interconnections 210.

A first bonding insulating layer 243 may be disposed in the third array layer L3. The first bonding insulating layer 243 may cover the first insulating layer 241. The first bonding insulating layer 243 may insulate the plurality of first peripheral circuit side bonding conductive patterns 250P1, the plurality of second peripheral circuit side bonding conductive patterns 250P2, and the plurality of peripheral circuit side auxiliary bonding conductive patterns 250D from each other. The plurality of first peripheral circuit side bonding conductive patterns 250P1, the plurality of second peripheral circuit side bonding conductive patterns 250P2, and the plurality of peripheral circuit side auxiliary bonding conductive patterns 250D may include copper, a copper alloy, or the same type of metal.

Each first peripheral circuit side bonding conductive pattern 250P1 may be disposed over the first conductive line 250L1 corresponding thereto. Each second peripheral circuit side bonding conductive pattern 250P2 may be disposed over the second conductive line 250L2 corresponding thereto. Hereinafter, the first conductive line 250L1 and the first peripheral circuit side bonding conductive pattern 250P1 connected to each other are defined as a first peripheral circuit side interconnection 25111, and the second conductive line 250L2 and the second peripheral circuit side bonding conductive pattern 250P2 connected to each other are defined as a second peripheral circuit side interconnection 25112. The plurality of peripheral circuit side auxiliary bonding conductive patterns 250D may overlap the first insulating layer 241. Each of the peripheral circuit side auxiliary bonding conductive patterns 250D may be insulated from the first peripheral circuit side interconnection 25111 and the second peripheral circuit side interconnection 25112 by the first insulating layer 241 and the first bonding insulating layer 243.

According to the above-described structure, the first insulating layer 241 may be considered to extend along one surface of each of the plurality of peripheral circuit side auxiliary bonding conductive patterns 250D and one surface of the first bonding insulating layer 243. The one surface of each of the plurality of peripheral circuit side auxiliary bonding conductive patterns 250D and the one surface of the first bonding insulating layer 243 may face the semiconductor substrate 201.

A second bonding insulating layer 351 may be disposed in the fourth array layer L4. The second bonding insulating layer 351 may be bonded to the first bonding insulating layer 243. Each of the first bonding insulating layer 243 and the second bonding insulating layer 351 may include silicon oxide, silicon oxynitride, silicon carbonitride, or the like. The second bonding insulating layer 351 may insulate the plurality of cell array side bonding conductive patterns 360BL and 360C and the plurality of cell array side auxiliary bonding conductive patterns 360D from each other. The plurality of cell array side bonding conductive patterns 360BL and 360C and the plurality of cell array side auxiliary bonding conductive patterns 360D may include copper, a copper alloy, or the same type of metal.

The plurality of cell array side bonding conductive patterns 360BL and 360C may include the plurality of bit lines 360BL respectively contacting the plurality of first peripheral circuit side bonding conductive patterns 250P1 and the plurality of connection patterns 360C respectively contacting the plurality of second peripheral circuit side bonding conductive patterns 250P2. The plurality of cell array side auxiliary bonding conductive patterns 360D may respectively contact the plurality of peripheral circuit side auxiliary bonding conductive patterns 250D. Differently from an embodiment of the present disclosure, in other embodiments, the plurality of cell array side auxiliary bonding conductive patterns 360D or the plurality of peripheral circuit side auxiliary bonding conductive patterns 250D may be omitted, or the plurality of cell array side auxiliary bonding conductive patterns 360D may be disposed not to overlap the plurality of peripheral circuit side auxiliary bonding conductive patterns 250D. In this case, the area in which the plurality of cell array side auxiliary bonding conductive patterns 360D contact the first bonding insulating layer 243 or the area in which the plurality of peripheral circuit side auxiliary bonding conductive patterns 250D contact the second bonding insulating layer 351 is increased as compared to other embodiments of the present disclosure. In addition, the bonding area between conductive materials is reduced as compared to the other embodiments of the present disclosure. As the contact area between an insulating material and a conductive material increases, stability of the bonding structure may deteriorate. In an embodiment of the present disclosure, the plurality of cell array side auxiliary bonding conductive patterns 360D may overlap the plurality of peripheral circuit side auxiliary bonding conductive patterns 250D so that the contact area between the insulating material and the conductive material is reduced. Accordingly, because an embodiment of the present disclosure may increase the bonding area between the conductive materials, the stability of the bonding structure may be improved.

A second insulating layer 345 may be disposed in the fifth array layer L5. The second insulating layer 345 may cover the second bonding insulating layer 351.

The sixth array layer L6 may include at least one intervening insulating layer disposed between the fifth array layer L5 and the memory cell array 110. As an embodiment, the sixth array layer L6 may include a first intervening insulating layer 331 between the fifth array layer L5 and the memory cell array 110 and a second intervening insulating layer 341 between the first intervening insulating layer 331 and the fifth array layer L5. The present disclosure is not limited thereto.

The sixth array layer L6 may include a plurality of first conductive via patterns 343A and a plurality of second conductive via patterns 343B passing through at least one of the first intervening insulating layer 331 and the second intervening insulating layer 341. The fifth array layer L5 may include a plurality of third conductive via patterns 347A and a plurality of fourth conductive via patterns 347B passing through the second insulating layer 345.

The plurality of first conductive via patterns 343A may be respectively connected to the plurality of third conductive via patterns 347A, and the plurality of second conductive via patterns 343B may be respectively connected to the plurality of fourth conductive via patterns 347B. The plurality of third conductive via patterns 347A may be respectively connected to the plurality of bit lines 360BL, and the plurality of fourth conductive via patterns 347B may be respectively connected to the plurality of connection patterns 360C. Hereinafter, the first conductive via pattern 343A, the third conductive via pattern 347A, and the bit line 360BL connected to each other are defined as a first cell array side interconnection 36111, and the second conductive via pattern 343B, the fourth conductive via pattern 347B, and the connection pattern 360C connected to each other are defined as a second cell array side interconnection 36112.

The first cell array side interconnection 36111 and the second cell array side interconnection 36112 may be insulated from the plurality of cell array side auxiliary bonding conductive patterns 360D by the second bonding insulating layer 351.

According to the above-described structure, the second insulating layer 345 may be considered to extend along one surface of each of the plurality of cell array side auxiliary bonding conductive patterns 360D and one surface of the second bonding insulating layer 351. The one surface of each of the plurality of cell array side auxiliary bonding conductive patterns 360D and the one surface of the second bonding insulating layer 351 may face the third direction D3 opposite to the direction facing the semiconductor substrate 201.

The gate stack GST of the memory cell array 110 may be partitioned by a gate isolation structure 321. The gate stack GST may include a plurality of interlayer insulating layers 311 and a plurality of conductive patterns 313. The plurality of interlayer insulating layers 311 and the plurality of conductive patterns 313 may be alternately stacked in the third direction D3.

The plurality of conductive patterns 313 may be insulated from each other by the plurality of interlayer insulating layers 311 and may be spaced apart from each other in the third direction D3. The plurality of conductive patterns 313 may form the drain select line DSL, the plurality of word lines WL, and the source select line SSL. The drain select line DSL may be formed of a conductive pattern of at least one layer adjacent to the bit line 360BL among the plurality of conductive patterns 313. The source select line may be formed of a conductive pattern of at least one layer disposed farthest from the bit line 360BL among the plurality of conductive patterns 313. Each word line WL may be formed of a conductive pattern between the drain select line DSL and the source select line SSL.

A plurality of ends of the plurality of conductive patterns 313 may form a step shape structure SW. For example, as the plurality of conductive patterns 313 extends to be longer to a side portion in a plane parallel to the upper surface TS of the semiconductor substrate 201 as the plurality of conductive patterns 313 are far away from the semiconductor substrate 201, and thus the step shape structure SW may be formed. A filling insulating layer 323 may be disposed between the step shape structure SW and the first intervening insulating layer 331. The filling insulating layer 323 may extend between the gate stack GST and the first intervening insulating layer 331.

Each cell plug CPL may include an end surrounded by the filling insulating layer 323. Each cell plug CPL may include a memory layer 315, a channel structure 317, and a core insulating layer 319.

The channel structure 317 may pass through the plurality of interlayer insulating layers 311 and the plurality of conductive patterns 313 of the gate stack GST. The channel structure 317 may be formed of a semiconductor layer such as silicon, to be used as a channel area of a memory cell string. The channel structure 317 may protrude in the third direction D3 than the gate stack GST and the memory layer 315. As an embodiment, the channel structure 317 may include a first portion P1, a second portion P2, and a third portion P3. The first portion P1 may be defined as a portion protruding in the third direction D3 than each of the gate stack GST and the memory layer 315. The second portion P2 may be defined as a portion extending from the first portion P1 toward the semiconductor substrate 201. The second portion P2 may be formed in a tubular shape. The second portion P2 of the tubular shape may surround a sidewall of the core insulating layer 319. The core insulating layer 319 may protrude in the third direction D3 than the memory layer 315 and may be surrounded by the first portion P1 of the channel structure 317. The channel structure 317 may include the third portion P3 extending from the second portion P2 toward the semiconductor substrate 201. The third portion P3 of the channel structure 317 may be doped with a conductivity type impurity. As an embodiment, the third portion P3 of the channel structure 317 may be doped with an n-type impurity. The third portion P3 of the channel structure 317 may include an area surrounded by the gate stack GST and an area surrounded by the filling insulating layer 323. The third portion P3 may be designed to have various lengths in the third direction D3 according to a design rule. The third portion P3 of the channel structure 317 may extend along a surface of the core insulating layer 319 facing the semiconductor substrate 201.

The conductive patterns 313 each used as the drain select line DSL may be insulated from each other at the same level by the select line isolation layer 325. The select line isolation layer 325 may pass through the filling insulating layer 323 and at least one interlayer insulating layer 311.

The memory layer 315 may be disposed between the gate stack GST and the channel structure 317, and may surround a sidewall of the channel structure 317. Although not shown in the drawing, the memory layer 315 may include a blocking insulating layer, a data storage layer, and a tunnel insulating layer. The blocking insulating layer may be disposed between each conductive pattern 313 and the channel structure 317, the data storage layer may be disposed between the blocking insulating layer and the channel structure 317, and the tunnel insulating layer may be disposed between the data storage layer and the channel structure 317. The data storage layer may be formed of a material layer capable of storing data that is changed using Fowler-Nordheim tunneling. The material layer may include a nitride layer capable of charge trapping. The present disclosure is not limited thereto, and the data storage layer may be formed of various materials such as a nano dot and a phase change material layer. The tunnel insulating layer may be formed of an insulating material capable of charge tunneling.

The memory cells may be formed at intersections of the channel structure 317 and the word lines WL, the source select transistor may be formed at an intersection of the channel structure 317 and the source select line SSL, and the drain select transistor may be formed at an intersection of the channel structure 317 and the drain select line DSL. The source select transistor, the drain select transistor, and the memory cells may be connected in series by the channel structure 317 to configure the memory cell string MS1 or MS2 described with reference to FIG. 3.

The channel structure 317 may be connected to the bit line 360BL corresponding thereto via the first conductive via pattern 343A and the third conductive via pattern 347A. Each conductive pattern 313 may be connected to the connection pattern 360C corresponding thereto via the second conductive via pattern 343B and the fourth conductive via pattern 347B.

The first conductive via pattern 343A may contact the channel structure 317 and may pass through the first intervening insulating layer 331 and the second intervening insulating layer 341. The third conductive via pattern 347A may contact the first conductive via pattern 343A and may pass through the second insulating layer 345. The third conductive via pattern 347A may contact the bit line 360BL.

According to the above-described structure, the junction 201J of the first transistor (for example, TR11) may be electrically connected to the bit line 360BL connected to the channel structure 317 via the lower interconnection 210, the first conductive line 250L1, and the first peripheral circuit side bonding conductive pattern 250P1.

Each of the plurality of conductive patterns 313 may contact the conductive gate contact 333 corresponding thereto. The conductive gate contact 333 may extend from an end of the conductive pattern 313 forming the step shape structure SW toward the semiconductor substrate 201. The conductive gate contact 333 may pass through the interlayer insulating layer 311, the filling insulating layer 323, and the first interlayer insulating layer 331.

The second conductive via pattern 343B may be connected to the conductive pattern 313 corresponding thereto via the conductive gate contact 333. The second conductive via pattern 343B may contact the conductive gate contact 333 and pass through the second intervening insulating layer 341. The fourth conductive via pattern 347B may contact the second conductive via pattern 343B and may pass through the second insulating layer 345. The fourth conductive via pattern 347B may contact the connection pattern 360C.

According to the above-described structure, the junction 201J of the second transistor TR2 may be electrically connected to the conductive gate contact 333 connected to the conductive pattern 313 via the lower interconnection 210, the second conductive line 250L2, the first peripheral circuit side bonding conductive pattern 250P2, and the connection pattern 360C.

The semiconductor memory device may include a source layer 380 on the memory cell array 110. The source layer 380 may extend to overlap the gate stack GST, the filling insulating layer 323, and the gate isolation structure 321. The source layer 380 may surround the first portion P1 of the channel structure 317. The source layer 380 may be formed of a doped semiconductor layer including at least one of an n-type impurity and a p-type impurity.

FIGS. 7A, 7B, 7C, 8A, 8B, 8C, 9A, 9B, 9C, 10A, 10B, 10C, 11A, 11B, and 11C are cross-sectional views illustrating a method of manufacturing a semiconductor memory device according to an embodiment of the present disclosure. Hereinafter, a repetitive description of the same configurations as those shown in FIGS. 6A to 6C is omitted.

Figure 7A:
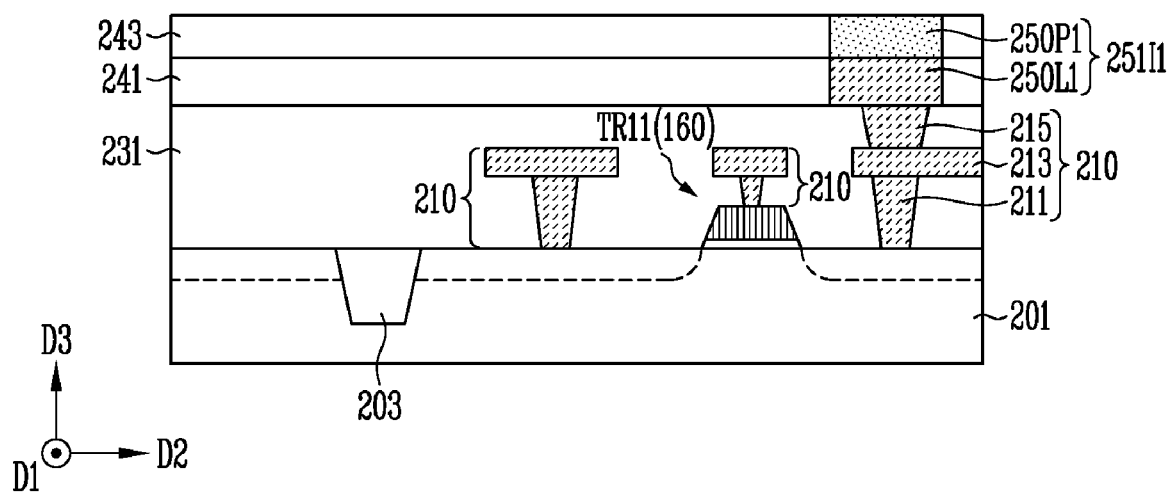
FIGS. 7A, 7B, 7C, 8A, 8B, 8C, 9A, 9B, 9C, 10A, 10B, 10C, 11A, 11B, and 11C are cross-sectional views illustrating a method of manufacturing a semiconductor memory device according to an embodiment of the present disclosure.
Figure 7B:
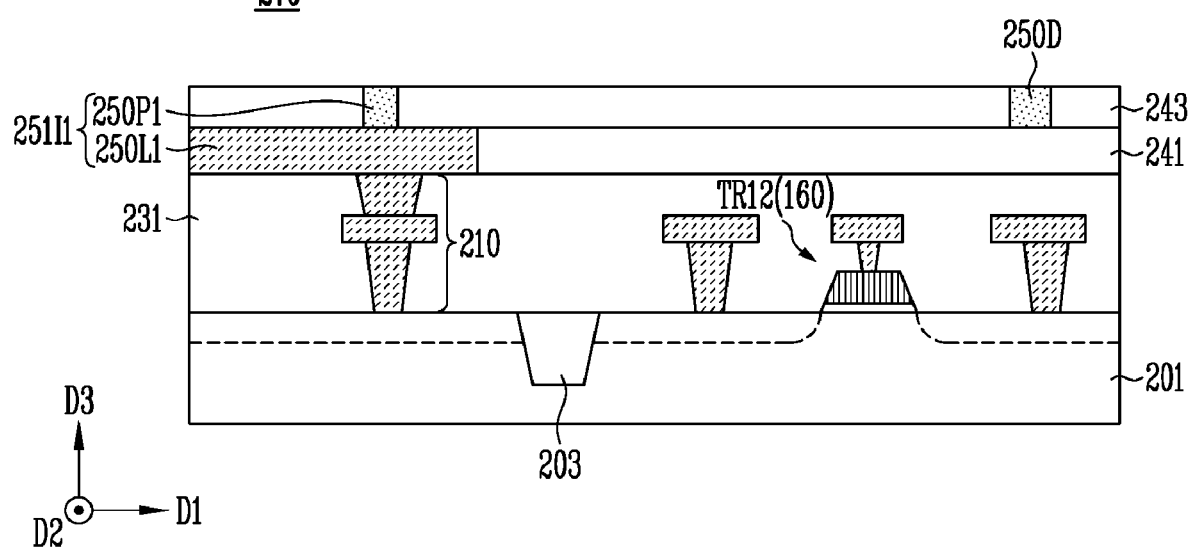
Figure 7C:
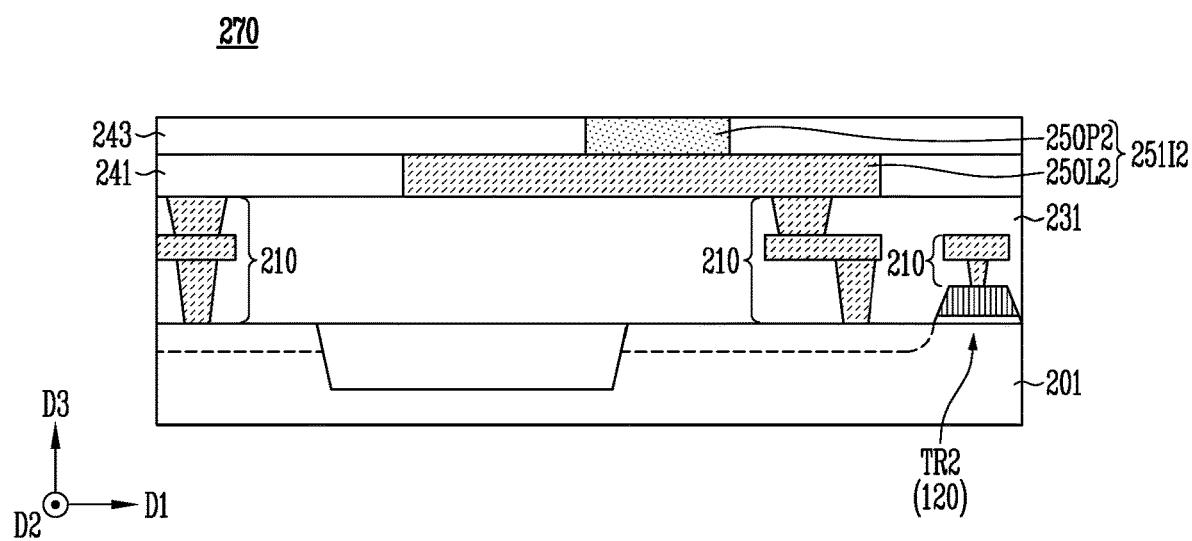

FIGS. 7A, 7B, and 7C are cross-sectional views illustrating forming a first structure 270.

Referring to FIGS. 7A to 7C, forming the first structure 270 may include forming the peripheral circuit structure including the plurality of first transistors TR11 and TR12 and the plurality of second transistors TR2. The plurality of first transistors TR11 and TR12 may configure the page buffer 160 of the peripheral circuit structure, and the plurality of second transistors TR2 may configure the row decoder 120 of the peripheral circuit structure.

The plurality of first transistors TR11 and TR12 and the plurality of second transistors TR2 may be insulated from each other by the element isolation layer 203 formed inside the semiconductor substrate 201. Each of the plurality of first transistors TR11 and TR12 and the plurality of second transistors TR2 may be formed in the active area of the semiconductor substrate 201 partitioned by the element isolation layer 203.

Forming the first structure 270 may include forming the lower insulating structure 231 and the lower interconnections 210. The lower insulating structure 231 may be formed on the semiconductor substrate 201 to cover the plurality of first transistors TR11 and TR12 and the plurality of second transistors TR2.

Conductive patterns (for example, the first to third conductive patterns 211, 213, and 215) configuring each lower interconnection 210 may be buried in the lower insulating structure 231. As an embodiment, forming the lower insulating structure 231 and the lower interconnections 210 may include forming a first lower insulating layer over the semiconductor substrate 201, forming the first conductive pattern 211 passing through the first lower insulating layer, forming a second lower insulating layer over the first lower insulating layer, forming the second conductive pattern 213 passing through the second lower insulating layer, forming a third lower insulating layer over the second lower insulating layer, and forming the third conductive pattern 215 passing through the third lower insulating layer. In this case, the lower insulating structure 231 may include the first lower insulating layer, the second lower insulating layer, and the third lower insulating layer.

Forming the first structure 270 may include forming the first insulating layer 241 to cover the lower insulating structure 231 and the plurality of lower interconnections 210, forming a plurality of trenches passing through the first insulating layers 241, forming the plurality of conductive lines 250L1 and 250L2 inside the plurality of trenches, forming the first bonding insulating layer 243 covering the plurality of conductive lines 250L1 and 250L2 and the first insulating layer 241, etching the first bonding insulating layer 243 to form a plurality of grooves exposing the plurality of conductive lines 250L1 and 250L2 and a plurality of auxiliary grooves spaced apart from the plurality of grooves, filling the plurality of grooves and the plurality of auxiliary grooves with a conductive material, and planarizing the conductive material to expose the first bonding insulating layer 243. At this time, a portion of the conductive material filling the plurality of grooves may be defined as the plurality of peripheral circuit side bonding conductive patterns 250P1 and 250P2, and a portion of the conductive material filling the plurality of auxiliary grooves may be defined as the plurality of peripheral circuit side auxiliary bonding conductive patterns 250D. Throughout different areas in the first bonding insulating layer 243, a difference in a density of conductive patterns may be reduced by the plurality of peripheral circuit side auxiliary bonding conductive patterns 250D. Accordingly, an embodiment of the present disclosure may reduce a dishing phenomenon that may be caused by the difference in the density of the conductive patterns in planarizing a conductive material by a chemical mechanical polishing (CMP) method or the like.

The plurality of peripheral circuit side bonding conductive patterns 250P1 and 250P2 may include a first peripheral circuit side bonding conductive pattern 250P1 and a second peripheral circuit side bonding conductive pattern 250P2. The plurality of conductive lines 250L1 and 250L2 may include a first conductive line 250L1 connected to the first peripheral circuit side bonding conductive pattern 250P1 and a second conductive line 250L2 connected to the second peripheral circuit side bonding conductive pattern 250P2. The first peripheral circuit side bonding conductive pattern 250P1 and the first conductive line 250L1 connected to each other may form the first peripheral circuit side interconnection 25111, and the second peripheral circuit side bonding conductive pattern 250P2 and the second conductive line 250L2 connected to each other may form the second peripheral circuit side interconnection 25112. The first peripheral circuit side interconnection 25111 may be in contact with the lower interconnection 210 corresponding thereto, and may be electrically connected to the first transistor (for example, TR11) of the page buffer 160 via the lower interconnection 210. The second peripheral circuit side interconnection 25112 may be in contact with the lower interconnection 210 corresponding thereto, and may be electrically connected to the second transistor TR2 of the row decoder 120 via the lower interconnection 210.

FIGS. 8A to 8C and 9A to 9C are cross-sectional views illustrating forming a second structure 370.

Figure 8A:
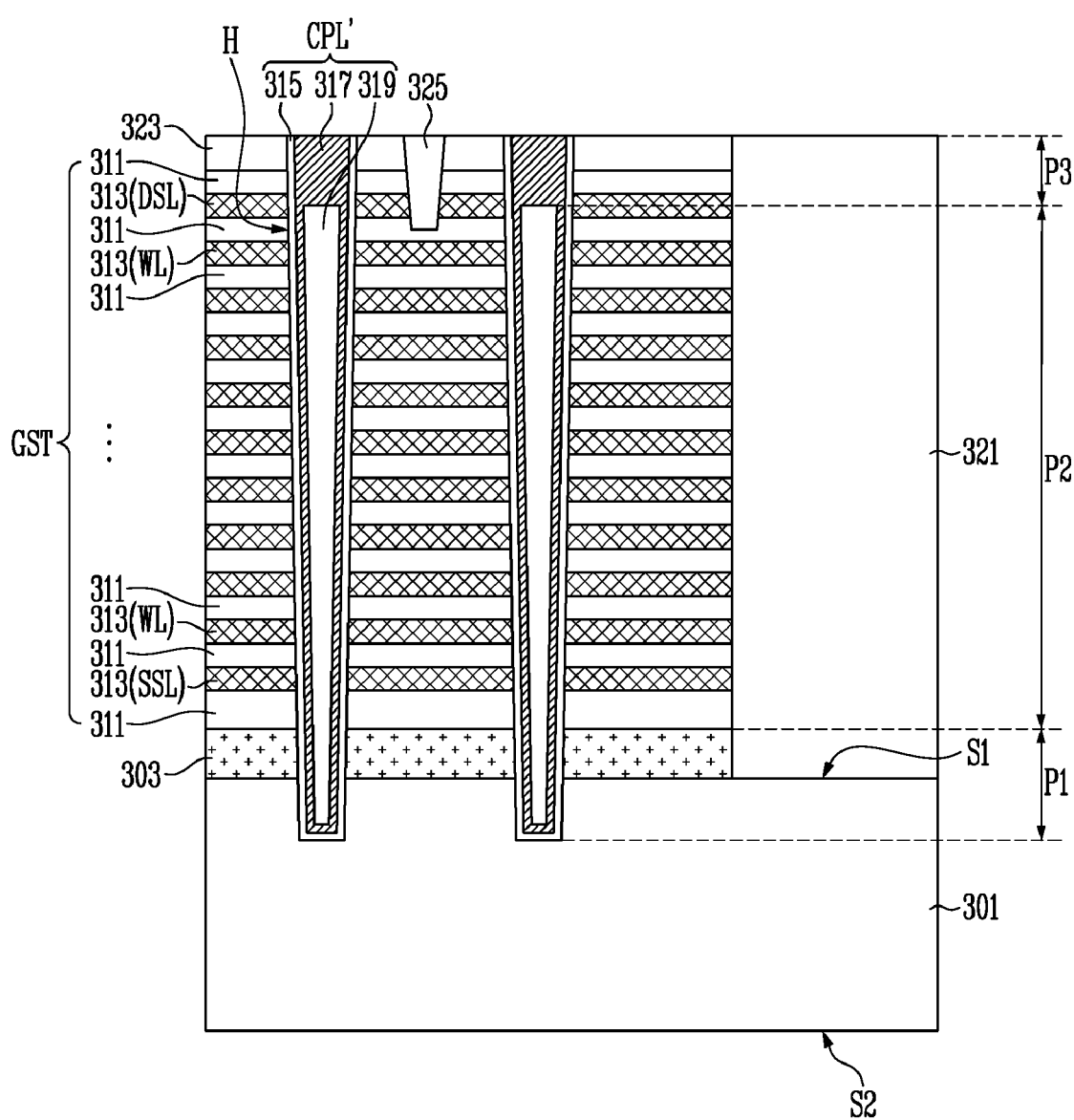
Figure 8B:
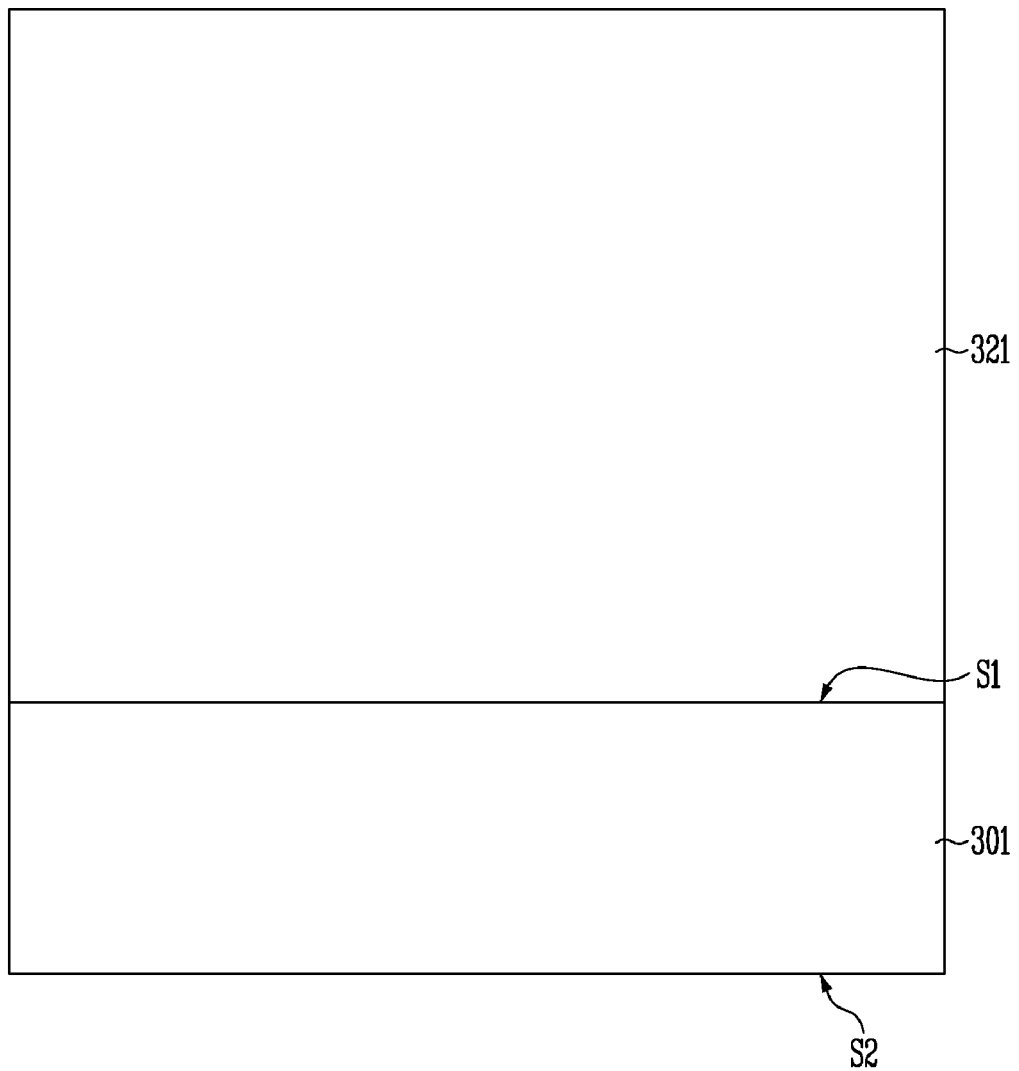
Figure 8C:
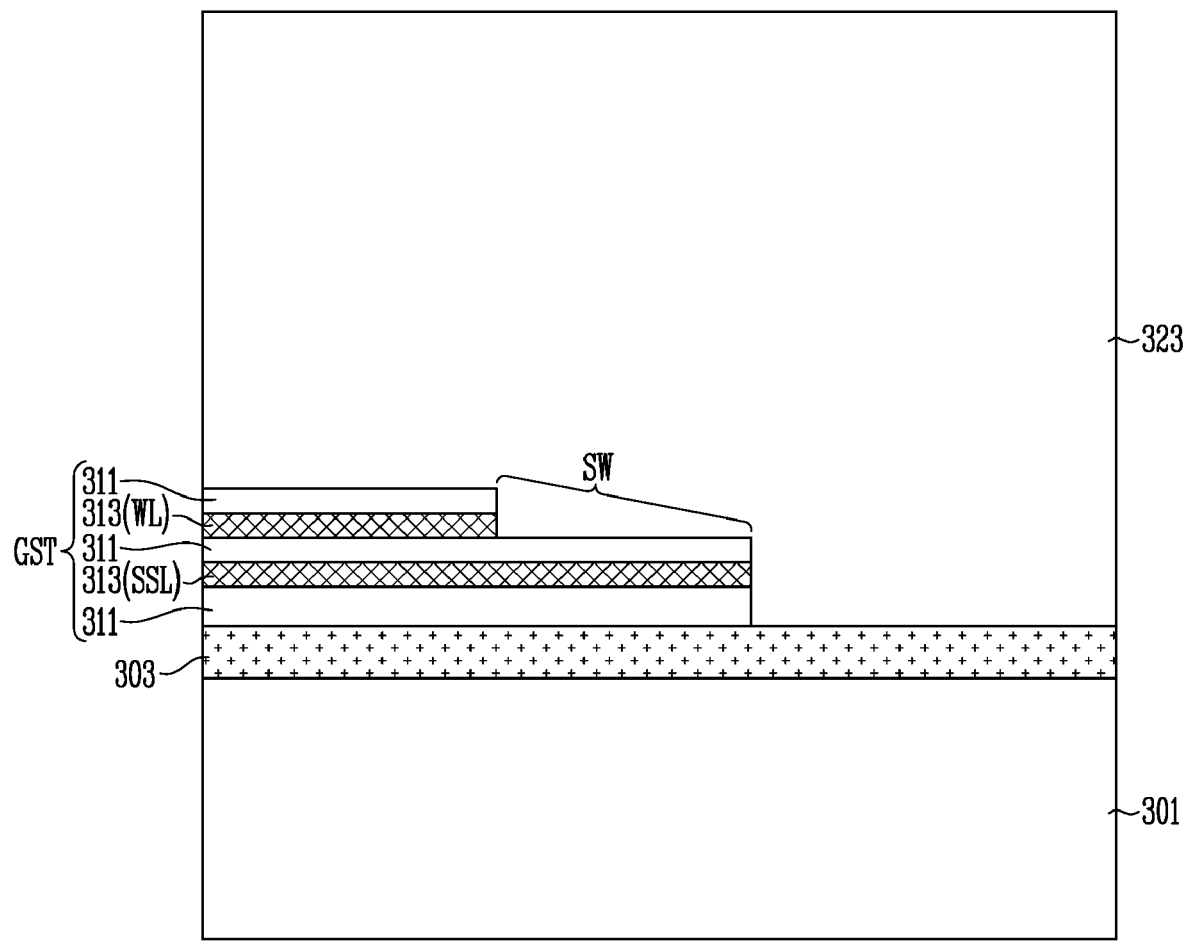

FIGS. 8A to 8C are cross-sectional views illustrating forming a memory cell array of the second structure 370.

Referring to FIGS. 8A to 8C, the memory cell array may be formed over a first surface S1 of a sacrificial substrate 301. Forming the memory cell array may include forming a protective layer 303 on the sacrificial substrate 301, alternately stacking a plurality of first material layers and a plurality of second material layers over the protective layer 303, forming a hole H passing through the plurality of first material layers and the plurality of second material layers and extending into the sacrificial substrate 301 by an etching process using a mask pattern as an etch barrier, forming a preliminary cell plug CPL' in the hole H, etching the plurality of first material layers and the plurality of second material layers to define the step shape structure SW, forming the gate isolation structure 321 passing through the protective layer 303 as well as the plurality of first material layers and the plurality of second material layers, removing the mask pattern, forming the filling insulating layer 323 to cover the step shape structure SW, and forming a slit (not shown) passing through the filling insulating layer 323 and the plurality of first material layers and the plurality of second material layers. The semiconductor substrate 201 may include a second surface S2 facing in a direction opposite to the first surface S1. The protective layer 303 may be formed of a material having an etch selectivity with respect to the semiconductor substrate 201. As an embodiment, the semiconductor substrate 201 may include silicon, and the protective layer 303 may include a nitride layer.

Forming the preliminary cell plug CPL' may include forming the memory layer 315, forming a liner semiconductor layer over the memory layer 315, and filling a portion of a central area of the hole H opened by the liner semiconductor layer with the core insulating layer 319, and filling a remaining portion of the central area of the hole H with a doped semiconductor layer. The doped semiconductor layer and the liner semiconductor layer may form the channel structure 317. The channel structure 317 may be used as the channel area of the memory cell string. Because the memory layer 315 extends along a sidewall and a bottom surface of the hole H, the memory layer 315 may be disposed between the sacrificial substrate 301 and the channel structure 317. The channel structure 317 may include the first portion P1 extending to a level where the sacrificial substrate 301 and the protective layer 303 are disposed, the second portion P2 extending from the first portion P1 in a direction away from the sacrificial substrate 301, and the third portion P3 extending from the second portion P2 onto the core insulating layer 319. The third portion P3 may include a conductivity type impurity, and may include an n-type impurity as an embodiment.

The first material layer and the second material layer may be formed of various materials. As an embodiment, the first material layer may be formed of the same insulating material as the plurality of interlayer insulating layers 311, and the second material layer may be formed of a sacrificial material having an etch selectivity with respect to the insulating material. As an embodiment, the first material layer may be formed of silicon oxide, and the second material layer may be formed of silicon nitride. Hereinafter, an embodiment of the present disclosure is described based on an embodiment in which the first material layer is formed of an insulating material and the second material layer is formed of a sacrificial material, but the present disclosure is not limited thereto.

Forming the memory cell array may further include selectively removing the plurality of second material layers formed as a sacrificial material through the slit (not shown), and respectively filling areas from which the plurality of second material layers are removed with the plurality of conductive patterns 313. Forming the memory cell array may further include forming the select line isolation structure 325. The select line isolation structure 325 may separate the conductive pattern 313 of at least one layer disposed farthest from the sacrificial substrate 301 among the plurality of conductive patterns 313 into the drain select lines DSL. Conductive patterns under the select line isolation structure 325 may be defined as the word lines WL and the source select line SSL.

Through the above-described process, the gate stack body GST of the memory cell array may be formed.

Figure 9A:
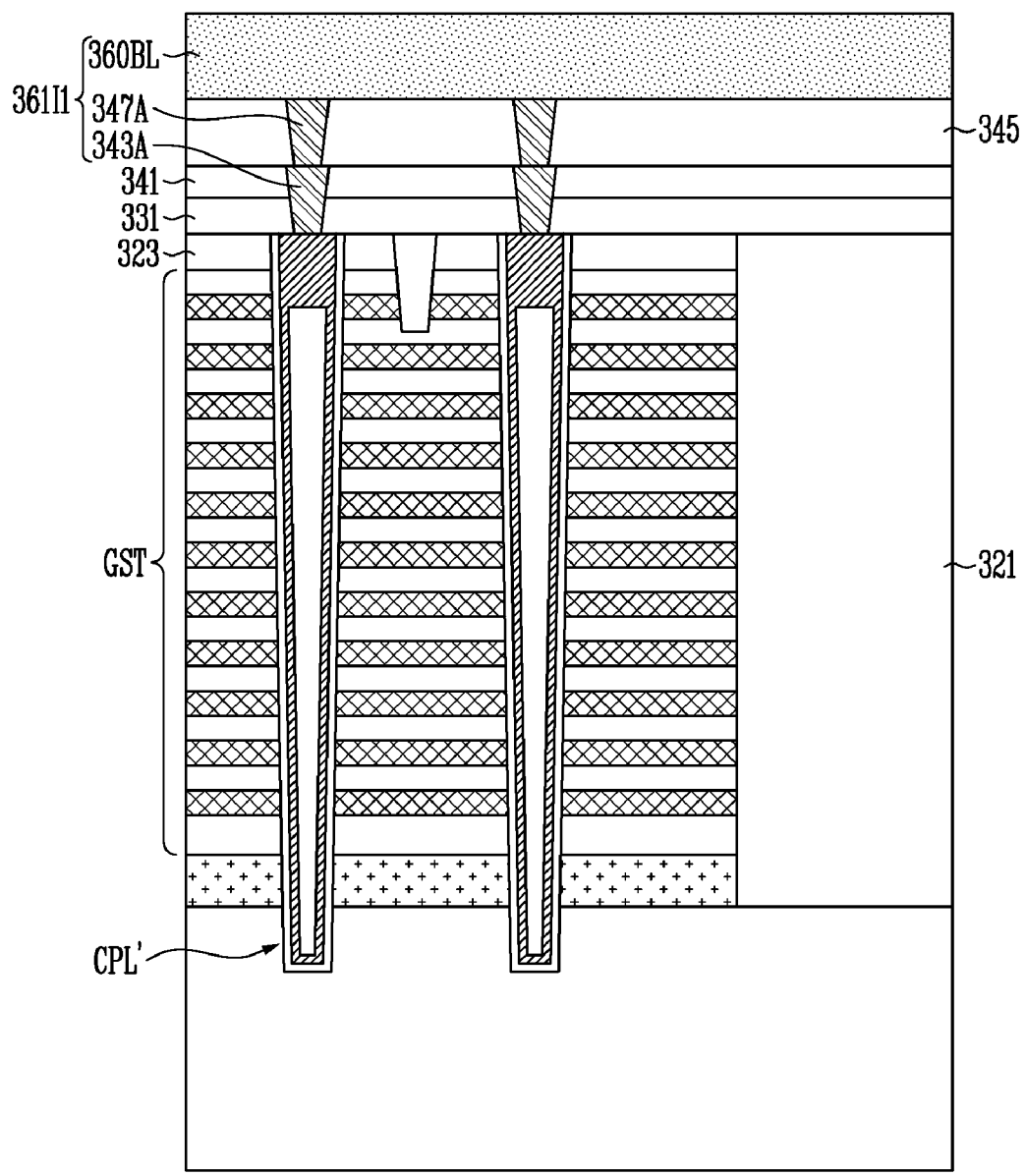
Figure 9B:
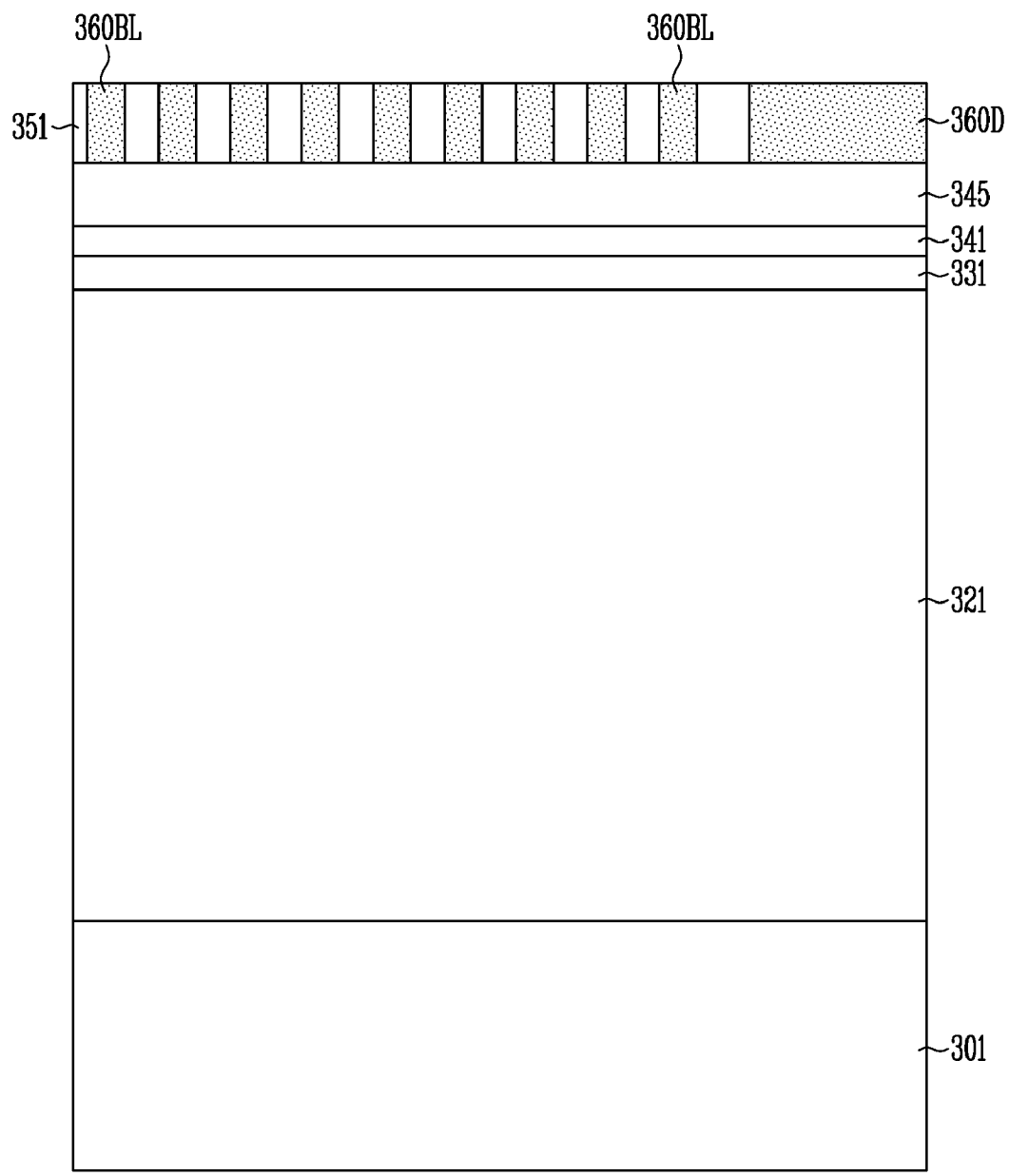
Figure 9C:
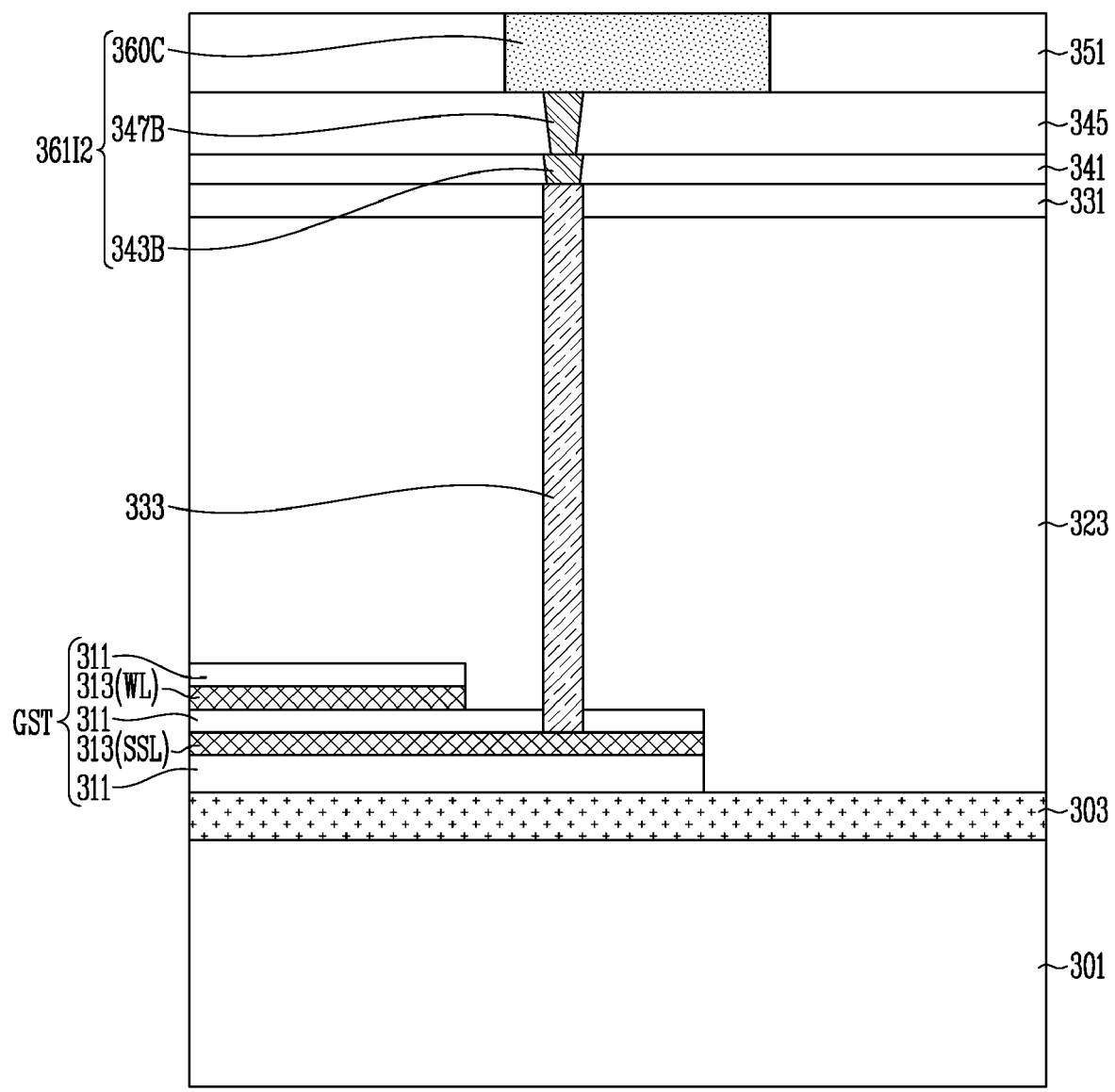

FIGS. 9A to 9C are cross-sectional views illustrating forming an upper structure of the second structure 370 overlapping the memory cell array.

Referring to FIGS. 9A to 9C, forming the second structure 370 may include forming the first intervening insulating layer 331 over the filling insulating layer 323 and the gate isolation structure 321, and forming the conductive gate contact 333 passing through the first intervening insulating layer 331 and the filling insulating layer 323. The first intervening insulating layer 331 may extend to cover the preliminary cell plug CPL'. The conductive gate contact 333 may pass through the interlayer insulating layer 311 between the filling insulating layer 323 and the conductive pattern 313 to be in contact with the conductive pattern 313 corresponding thereto.

Forming the second structure 370 may include forming the second intervening insulating layer 341 over the first intervening insulating layer 331 and forming the first conductive via pattern 343A and the second conductive via pattern 343B passing through at least any one of the first intervening insulating layer 331 and the second intervening insulating layer 341. The first conductive via pattern 343A may contact the preliminary cell plug CPL' by passing through the first intervening insulating layer 331 and the second intervening insulating layer 341 overlapping the preliminary cell plug CPL'. The second conductive via pattern 343B may contact the conductive gate contact 333 by passing through the second intervening insulating layer 341 overlapping the conductive gate contact 333.

Forming the second structure 370 may include forming the second insulating layer 345 on the second intervening insulating layer 341 and forming the third conductive via pattern 347A and the fourth conductive via pattern 347B passing through the second insulating layer 345. The second insulating layer 345 may be formed to overlap the first conductive via pattern 343A and the second conductive via pattern 343B. The third conductive via pattern 347A may contact the first conductive via pattern 343A by passing through a portion of the second insulating layer 345 overlapping the first conductive via pattern 343A. The fourth conductive via pattern 347B may contact the second conductive via pattern 343B by passing through a portion of the second insulating layer 345 overlapping the second conductive via pattern 343B.

Forming the second structure 370 may include forming the second bonding insulating layer 351 over the second insulating layer 345, etching the second bonding insulating layer 351 to form the plurality of trenches and the plurality of auxiliary grooves, filling the plurality of trenches, the plurality of grooves, and the plurality of auxiliary grooves with a conductive material, and planarizing the conductive material to expose the second bonding insulating layer 351. At this time, a portion of the conductive material filling the plurality of trenches may be defined as the plurality of cell array side bonding conductive patterns 360BL and 360C, and a portion of the conductive material filling the plurality of auxiliary grooves may be defined as the cell array side auxiliary bonding conductive patterns 360D. Throughout different areas in the second bonding insulating layer 351, the difference in the density of the conductive patterns may be reduced by the plurality of cell array side auxiliary bonding conductive patterns 360D. Accordingly, an embodiment of the present disclosure may reduce a dishing phenomenon that may be caused by the difference in the density of the conductive patterns in planarizing a conductive material by a chemical mechanical polishing (CMP) method or the like.

The plurality of cell array side bonding conductive patterns 360BL and 360C may include the bit line 360BL connected to the third conductive via pattern 347A and the connection pattern 360C connected to the fourth conductive via pattern 347B. The first conductive via pattern 343A, the third conductive via pattern 347A, and the bit line 360BL connected to each other may be defined as the first cell array side interconnection 36111. The second conductive via pattern 343B, the fourth conductive via pattern 347B, and the connection pattern 360C connected to each other may be defined as the second cell array side interconnection 36112. The first cell array side interconnection 36111 may be connected to the channel structure 317 of the preliminary cell plug CPL'. The second cell array side interconnection 36112 may be connected to the conductive pattern 313 corresponding thereto via the conductive gate contact 333.

Figure 10A:
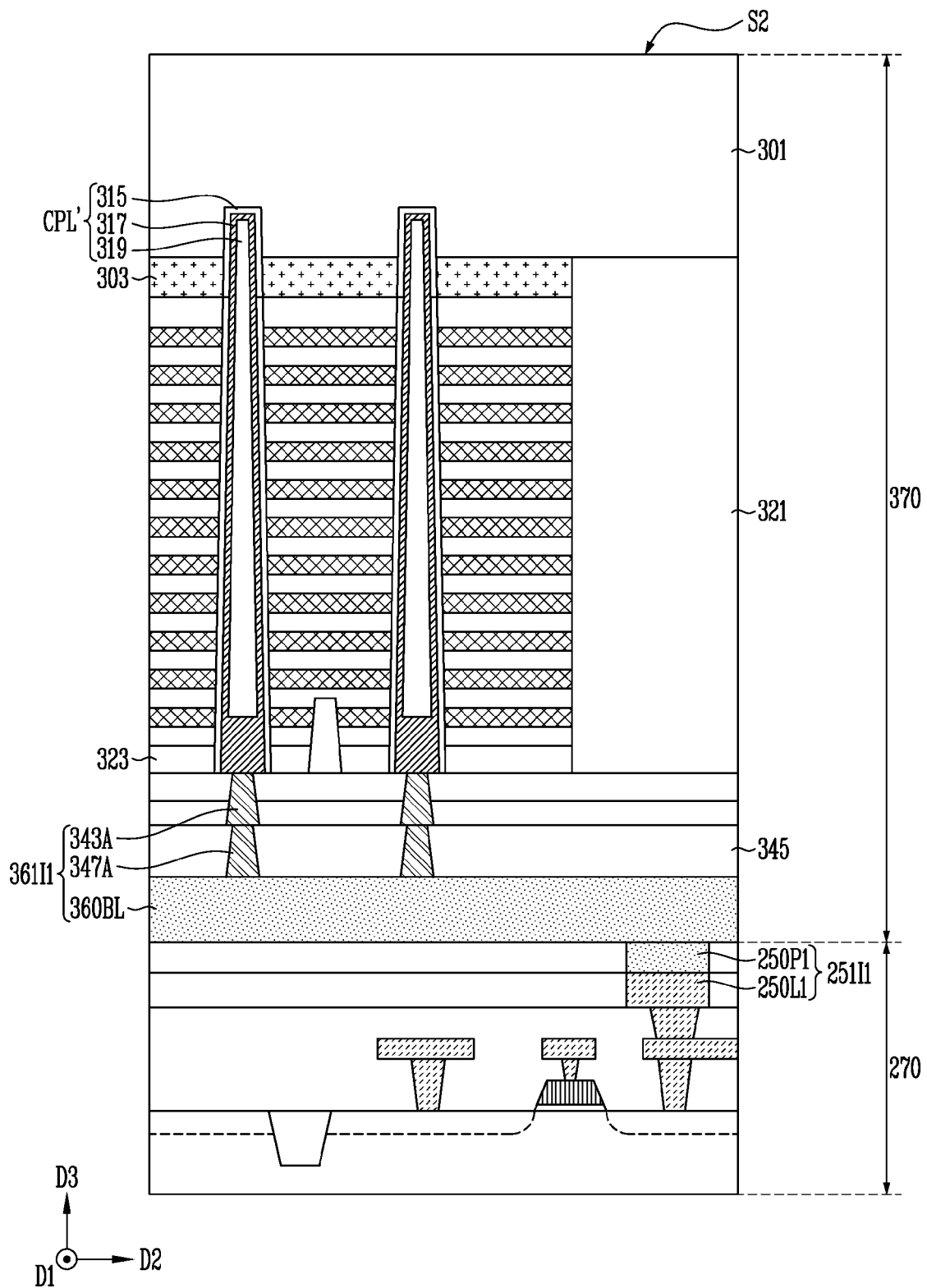
Figure 10B:
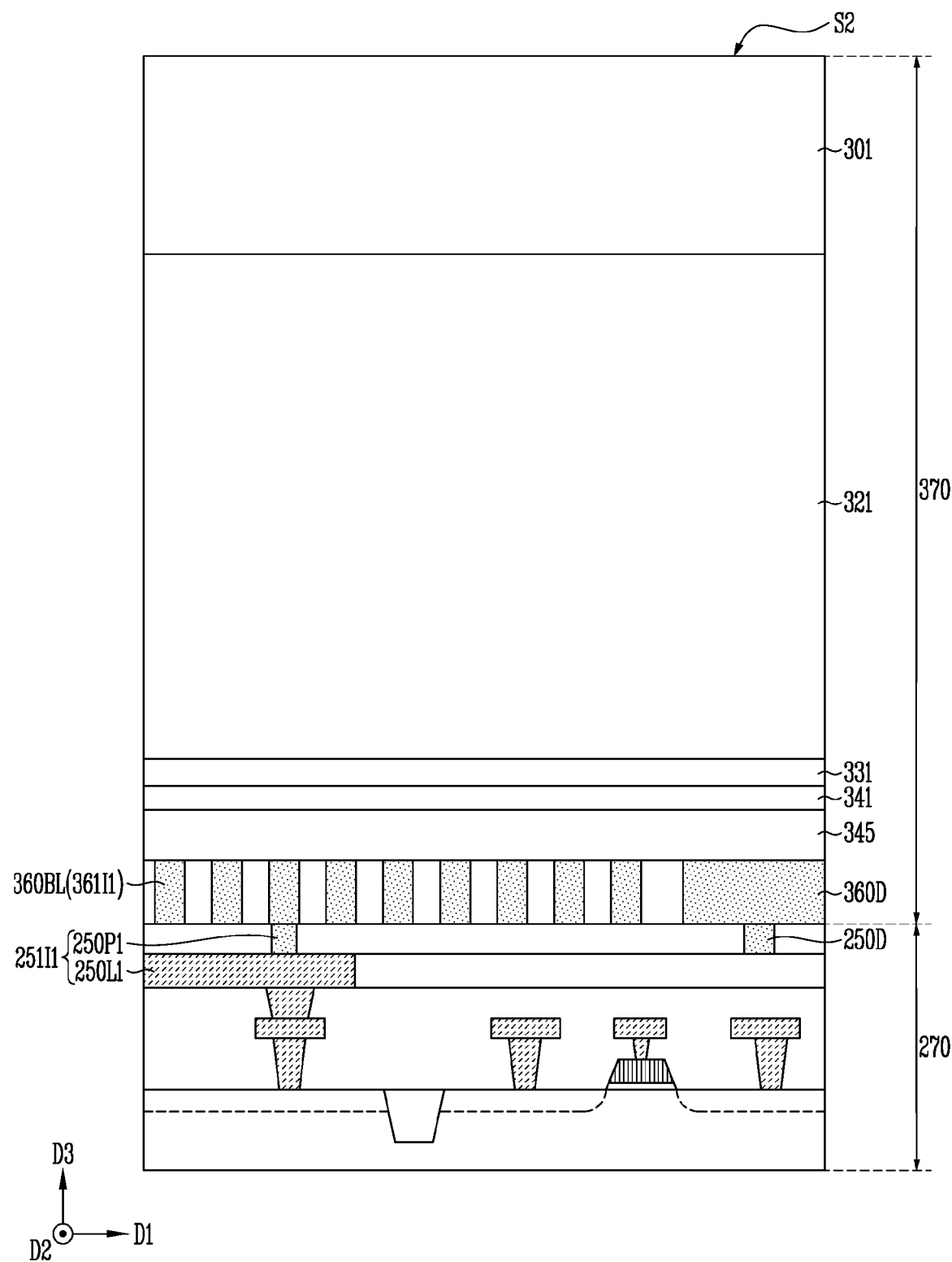
Figure 10C:
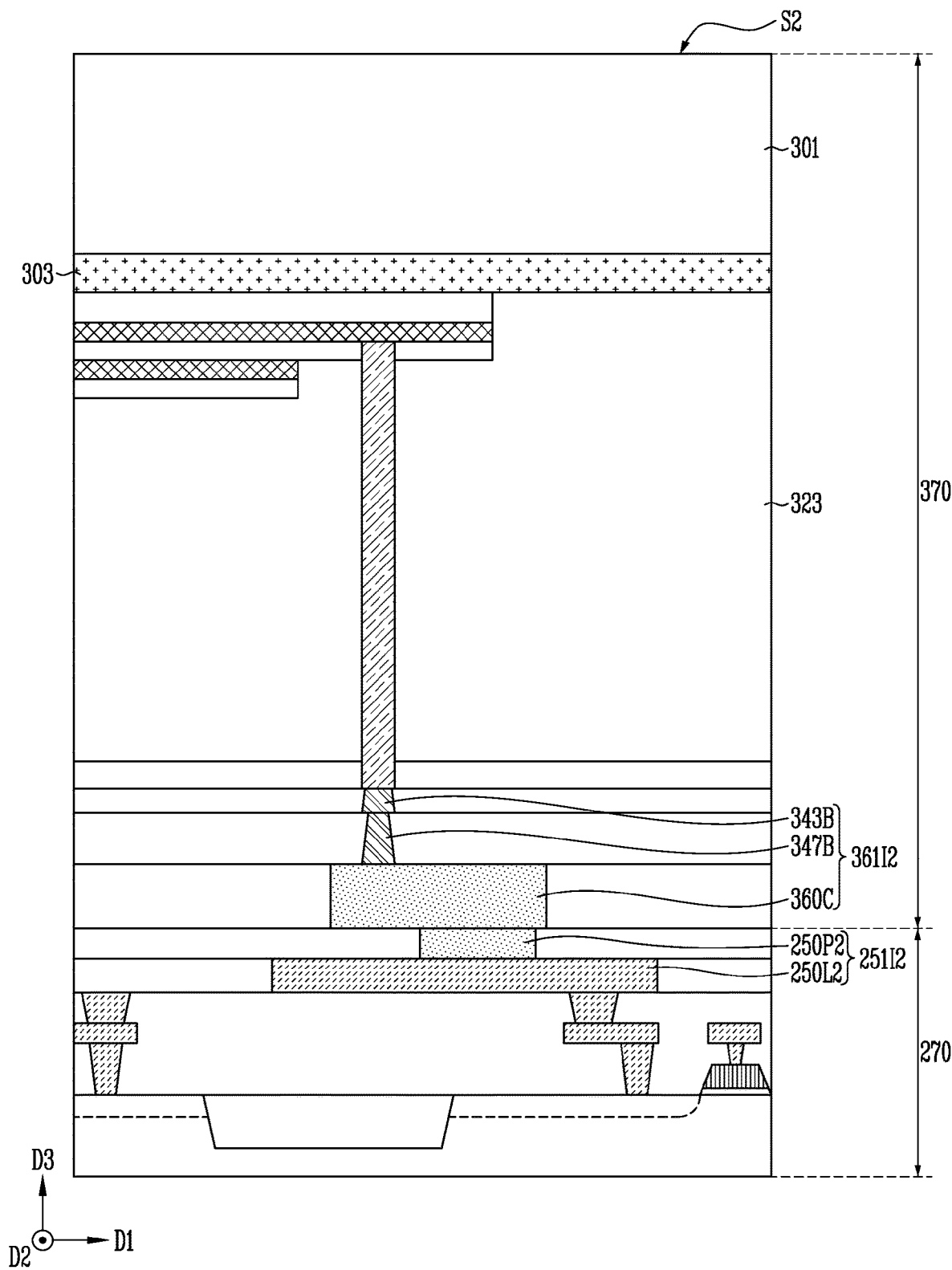

FIGS. 10A to 10C are cross-sectional views illustrating bonding the first structure 270 shown in FIGS. 7A to 7C and the second structure 370 shown in FIGS. 9A to 9C to each other.

Referring to FIGS. 10A to 10C, the individually provided first structure 270 and second structure 370 may be combined to each other by a bonding process. The first peripheral circuit side interconnection 25111 of the first structure 270 and the first cell array side interconnection 36111 of the second structure 370 may be electrically connected to each other by bonding between the first peripheral circuit side bonding conductive pattern 250P1 and the bit line 360BL. The second peripheral circuit side interconnection 25112 of the first structure 270 and the second cell array side interconnection 36112 of the second structure 370 may be electrically connected to each other by bonding between the second peripheral circuit side bonding conductive pattern 250P2 and the connection pattern 360C. The peripheral circuit side auxiliary bonding conductive pattern 250D of the first structure 270 may be bonded to the cell array side auxiliary bonding conductive pattern 360D of the second structure 370. Accordingly, in an embodiment, stability of a bonding structure between the first structure 270 and the second structure 370 may be improved.

Figure 11A:
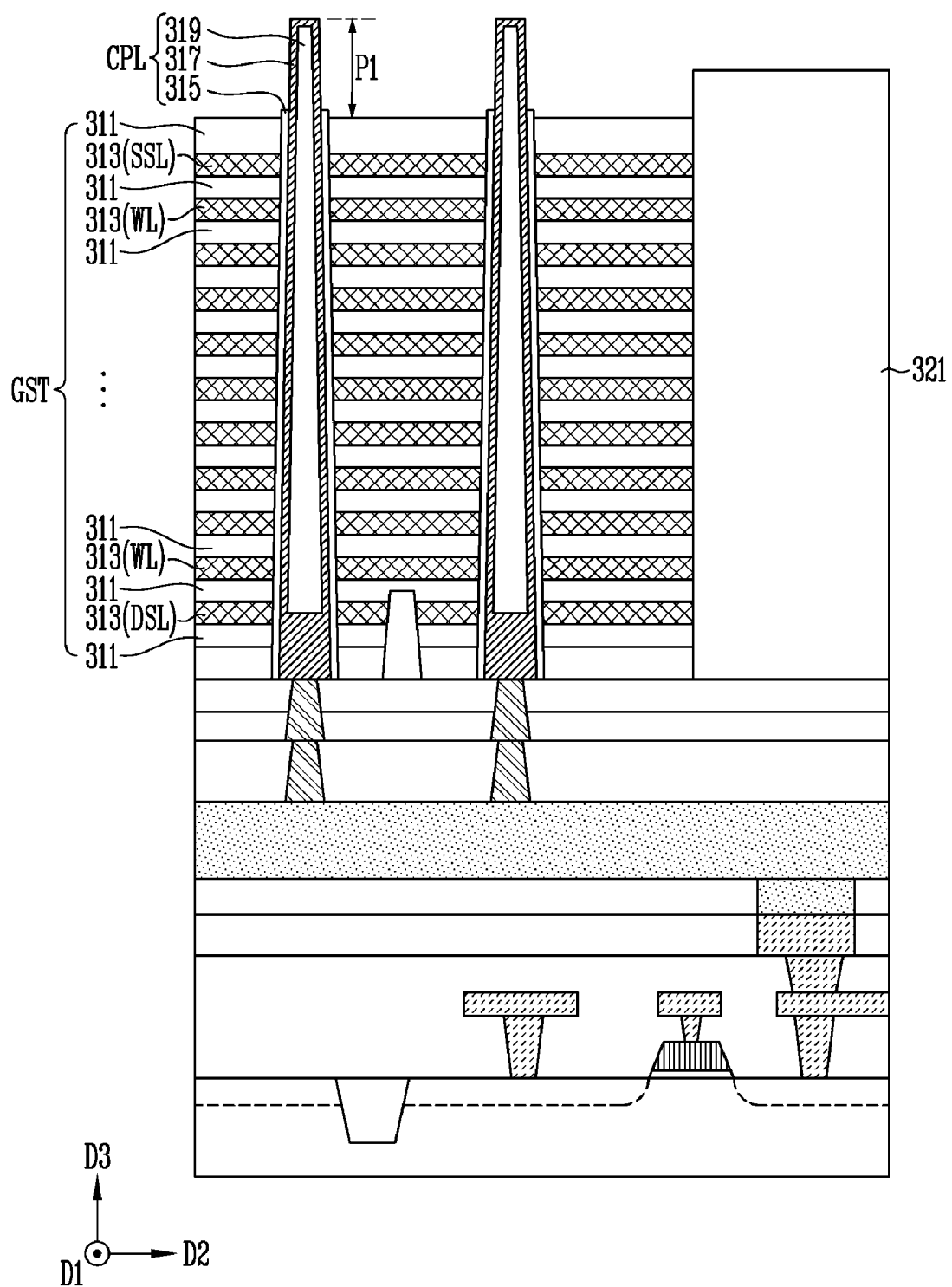
Figure 11B:
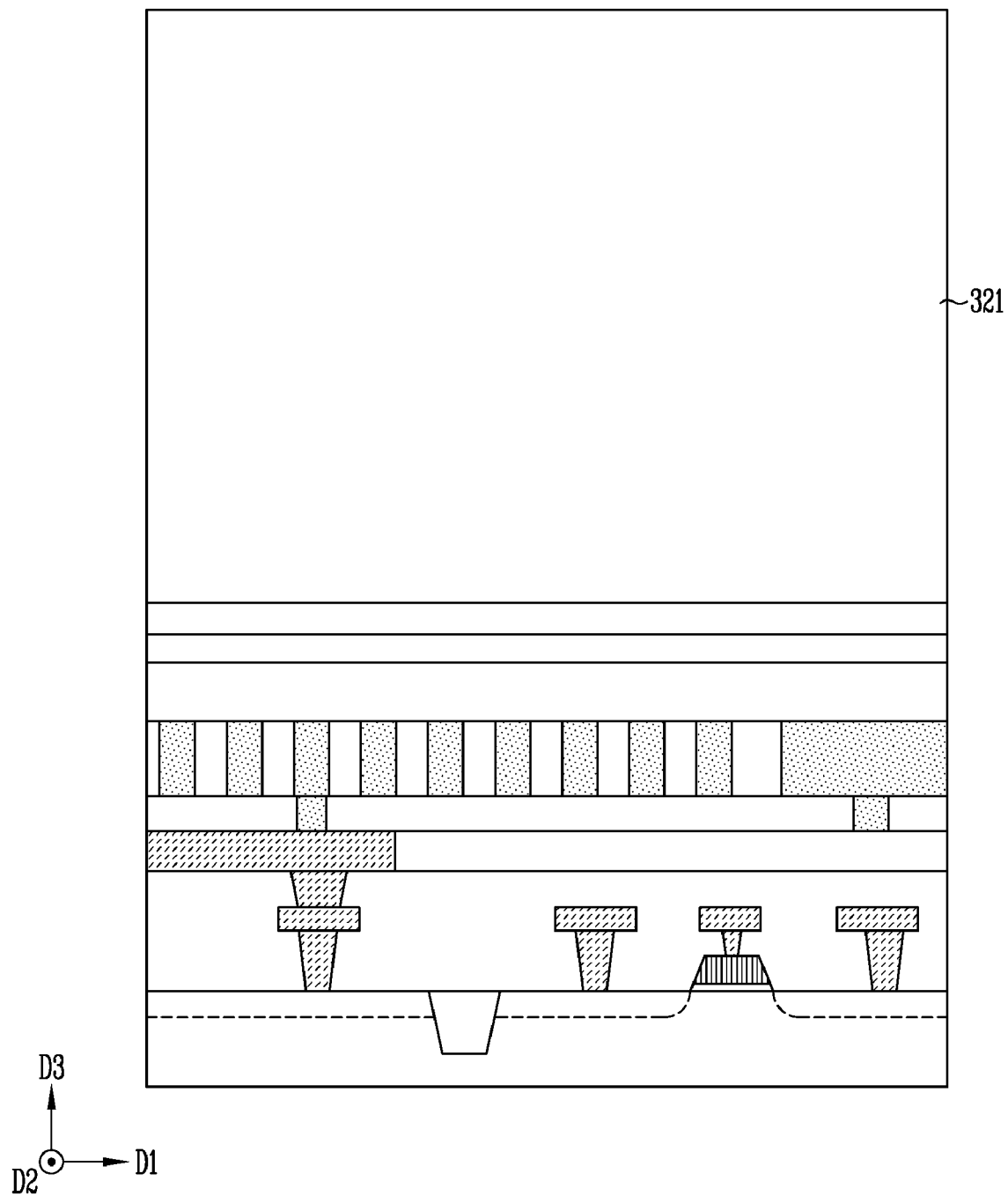
Figure 11C:
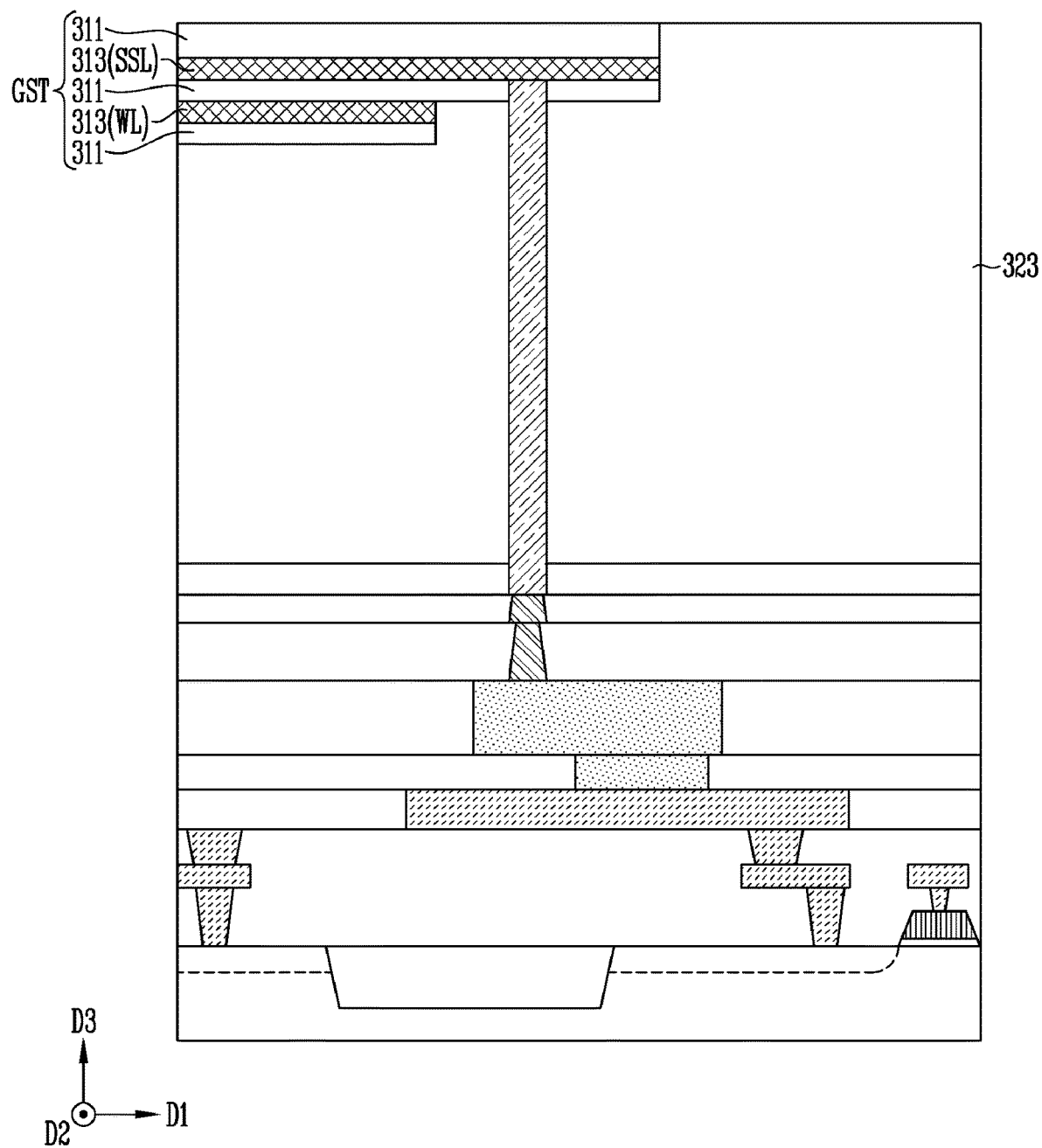

FIGS. 11A to 11C illustrate exposing the first portion P1 of the channel structure 317.

Referring to FIGS. 11A to 11C, a portion of the memory layer 315 may be exposed by removing the sacrificial substrate 301 shown in FIGS. 10A to 10C. The sacrificial substrate 301 shown in FIGS. 10A to 10C may be removed from the second surface S2. While the sacrificial substrate 301 is removed, the protective layer 303 shown in FIGS. 10A and 10C may serve as an etch stop layer. Subsequently, the protective layer 303 shown in FIGS. 10A and 10C may be removed.

Thereafter, the first portion P1 of the channel structure 317 may be exposed by removing a portion of the memory layer 315. Subsequently, the source layer 380 shown in FIGS. 6A to 6C may be formed.

Figure 12:
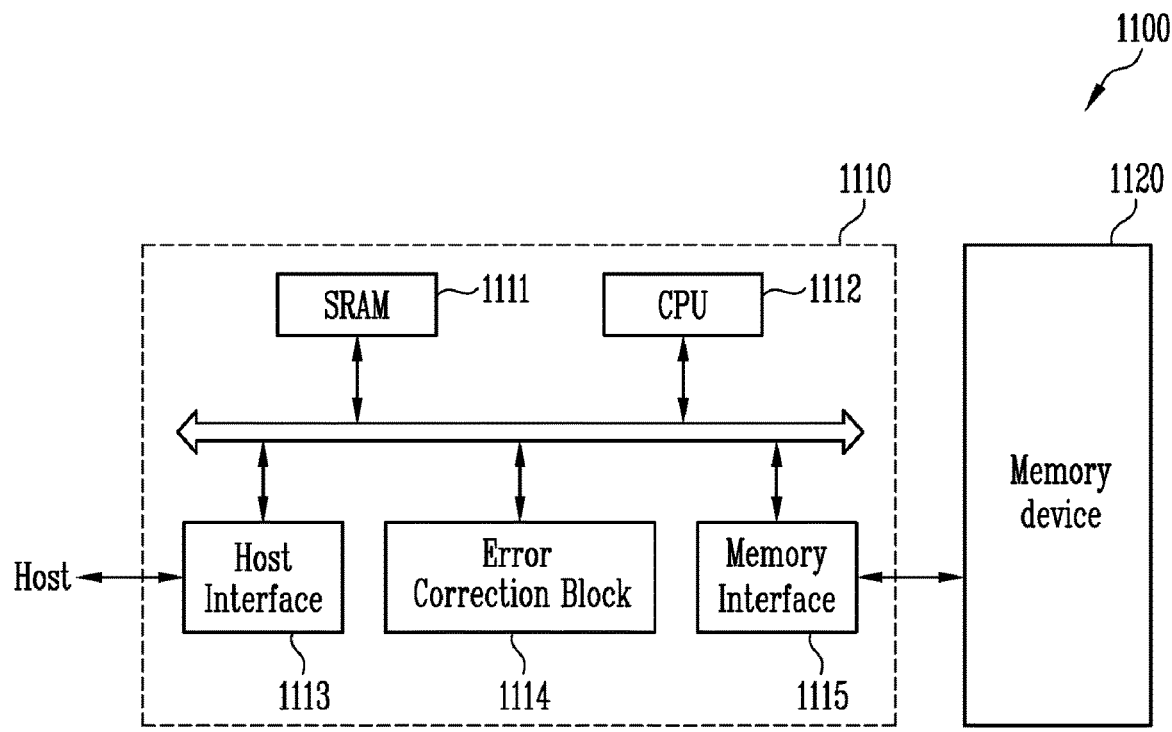
FIG. 12 is a block diagram illustrating a configuration of a memory system according to an embodiment of the present disclosure.

FIG. 12 is a block diagram illustrating a configuration of a memory system according to an embodiment of the present disclosure.

Referring to FIG. 12, the memory system 1100 includes a memory device 1120 and a memory controller 1110.

The memory device 1120 may be a multi-chip package configured of a plurality of flash memory chips. The memory device 1120 may include a peripheral circuit side bonding conductive pattern and a cell array side bonding conductive pattern for electrically connecting and bonding a memory cell array and a peripheral circuit structure to each other. In addition, the memory device 1120 may include a peripheral circuit side auxiliary bonding conductive pattern disposed at a level at which the peripheral circuit side bonding conductive pattern is disposed and a cell array side auxiliary bonding conductive pattern disposed at a level at which the cell array side bonding conductive pattern is disposed. The peripheral circuit side auxiliary bonding conductive pattern may be in contact with the cell array side auxiliary bonding conductive pattern.

The memory controller 1110 may be configured to control the memory device 1120, and may include a static random access memory (SRAM) 1111, a central processing unit (CPU) 1112, a host interface 1113, an error correction block 1114, and a memory interface 1115. The SRAM 1111 is used as an operation memory of the CPU 1112, the CPU 1112 performs an overall control operation for data exchange of the memory controller 1110, and the host interface 1113 include a data exchange protocol of a host connected to the memory system 1100. The error correction block 1114 detects an error included in data read from the memory device 1120 and corrects the detected error. The memory interface 1115 performs interfacing with the memory device 1120. The memory controller 1110 may further include a read only memory (ROM) that stores code data for interfacing with the host.

The above-described memory system 1100 may be a memory card or a solid state drive (SSD) in which the memory device 1120 and the memory controller 1110 are combined. For example, when the memory system 1100 is the SSD, the memory controller 1110 may communicate with the outside (for example, the host) through one of various interface protocols such as a universal serial bus (USB), a multimedia card (MMC), a peripheral component interconnection-express (PCI-E), a serial advanced technology attachment (SATA), a parallel advanced technology attachment (PATA), a small computer system interface (SCSI), an enhanced small disk interface (ESDI), and integrated drive electronics (IDE).

Figure 13:
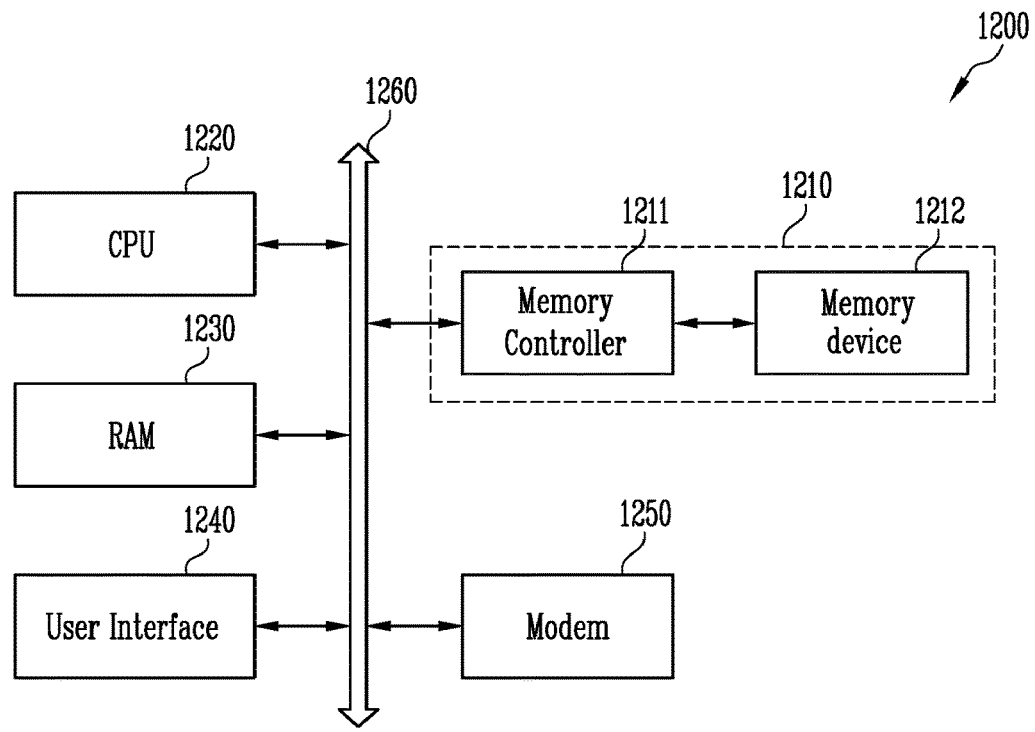
FIG. 13 is a block diagram illustrating a configuration of a computing system according to an embodiment of the present disclosure.

FIG. 13 is a block diagram illustrating a configuration of a computing system according to an embodiment of the present disclosure.

Referring to FIG. 13, the computing system 1200 may include a CPU 1220, a random access memory (RAM) 1230, a user interface 1240, a modem 1250, and a memory system 1210 electrically connected to a system bus 1260. When the computing system 1200 is a mobile device, a battery for supplying an operation voltage to the computing system 1200 may be further included, and an application chipset, an image processor, a mobile DRAM, and the like may be further included.

The memory system 1210 may include a memory device 1212 and a memory controller 1211.

The memory device 1212 may have the same configuration as the memory device 1120 described above with reference to FIG. 12.

The memory controller 1211 may have the same configuration as the memory controller 1110 described above with reference to FIG. 12.

Embodiments of the present disclosure may reduce a difference in pattern density throughout different areas in a bonding layer in which a bonding conductive pattern is disposed by disposing an auxiliary bonding conductive pattern in an extra area in the bonding layer. Accordingly, in an embodiment, stability of a manufacturing process may be improved.

Embodiments of the present disclosure may reduce a contact area between an auxiliary bonding conductive pattern and a bonding insulating layer by allowing the auxiliary bonding conductive patterns disposed in different layers to contact each other. Accordingly, in an embodiment, stability of a bonding structure may be improved.

What is claimed is:

1. A semiconductor memory device comprising:
a peripheral circuit structure disposed in a semiconductor substrate and a first array layer over the semiconductor substrate;
a conductive line disposed in a second array layer, wherein the second array layer is over the first array layer, and wherein the conductive line is connected to the peripheral circuit structure;
a peripheral circuit side bonding conductive pattern disposed in a third array layer, wherein the third array layer is over the second array layer, and wherein the peripheral circuit side bonding conductive pattern is connected to the conductive line;
a peripheral circuit side auxiliary bonding conductive pattern disposed in the third array layer, the peripheral circuit side auxiliary bonding conductive pattern spaced apart from the peripheral circuit side bonding conductive pattern;
a cell array side bonding conductive pattern disposed in a fourth array layer, the fourth array layer over the third array layer, the cell array side bonding conductive pattern contacting the peripheral circuit side bonding conductive pattern;
a cell array side auxiliary bonding conductive pattern disposed in the fourth array layer, the cell array side auxiliary bonding conductive pattern contacting the peripheral circuit side auxiliary bonding conductive pattern; and
a memory cell array disposed over the fourth array layer, the memory cell array connected to the cell array side bonding conductive pattern.

2. The semiconductor memory device of claim 1, further comprising:
a first insulating layer disposed in the second array layer and penetrated by the conductive line;
a first bonding insulating layer between the peripheral circuit side bonding conductive pattern and the peripheral circuit side auxiliary bonding conductive pattern; and
a second bonding insulating layer between the cell array side bonding conductive pattern and the cell array side auxiliary bonding conductive pattern.

3. The semiconductor memory device of claim 2, wherein the peripheral circuit side auxiliary bonding conductive pattern overlaps the first insulating layer and is spaced apart from the conductive line of the second array layer.

4. The semiconductor memory device of claim 1, wherein the memory cell array comprises:
a plurality of conductive patterns spaced apart from each other and stacked over the fourth array layer;
a channel structure passing through the plurality of conductive patterns; and
a memory layer between each of the plurality of conductive patterns and the channel structure.

5. The semiconductor memory device of claim 4, wherein the cell array side bonding conductive pattern forms a bit line connected to the channel structure, the peripheral circuit structure includes a first transistor having a junction formed in the semiconductor substrate, and
the junction of the first transistor is electrically connected to the bit line via the conductive line and the peripheral circuit side bonding conductive pattern.

6. The semiconductor memory device of claim 4, further comprising:
a conductive gate contact extending from one of the plurality of conductive patterns toward the fourth array layer.

7. The semiconductor memory device of claim 6, wherein the cell array side bonding conductive pattern forms a connection pattern connected to the conductive gate contact,
the peripheral circuit structure includes a second transistor having a junction formed in the semiconductor substrate, and
the junction of the second transistor is electrically connected to the conductive gate contact via the conductive line, the peripheral circuit side bonding conductive pattern, and the connection pattern.

8. A semiconductor memory device comprising:
a semiconductor substrate having an upper surface, the upper surface extending in a horizontal direction and facing a vertical direction;
a memory cell array including a gate stack, the gate stack including a plurality of conductive patterns spaced apart from each other in the vertical direction, the memory cell array stacked over the semiconductor substrate;
a channel structure extending to pass through the plurality of conductive patterns;
a memory layer between the channel structure and the gate stack;
a plurality of peripheral circuit side bonding conductive patterns included in a first bonding array layer and a plurality of peripheral circuit side auxiliary bonding conductive patterns included in the first bonding array layer, the plurality of peripheral circuit side bonding conductive patterns spaced apart from the plurality of peripheral circuit side auxiliary bonding conductive patterns, wherein the first bonding array layer is between the memory cell array and the semiconductor substrate;
a plurality of cell array side bonding conductive patterns included in a second bonding array layer and a plurality of cell array side auxiliary bonding conductive patterns included in the second bonding array layer, the plurality of cell array side bonding conductive patterns spaced apart from the plurality of cell array side auxiliary bonding conductive patterns, wherein the second bonding array layer is between the first bonding array layer and the memory cell array; and
a plurality of conductive lines disposed between the first bonding array layer and the semiconductor substrate and respectively connected to the plurality of peripheral circuit side bonding conductive patterns.

9. The semiconductor memory device of claim 8, wherein the plurality of cell array side bonding conductive patterns are in direct contact with the plurality of peripheral circuit side bonding conductive patterns, and
the plurality of cell array side auxiliary bonding conductive patterns are in direct contact with the plurality of peripheral circuit side auxiliary bonding conductive patterns.

10. The semiconductor memory device of claim 8,
wherein the plurality of peripheral circuit side auxiliary bonding conductive patterns are spaced apart from the cell array side bonding conductive patterns,
wherein the plurality of peripheral circuit side auxiliary bonding conductive patterns are spaced apart from the plurality of conductive lines, and
wherein the plurality of cell array side auxiliary bonding conductive patterns are spaced apart from the peripheral circuit side bonding conductive patterns.

11. The semiconductor memory device of claim 8, further comprising:
a first bonding insulating layer disposed in the first bonding array layer, the first bonding insulating layer penetrated by the plurality of peripheral circuit side bonding conductive patterns and the plurality of peripheral circuit side auxiliary bonding conductive patterns;
a first insulating layer extending along one surface of the first bonding insulating layer facing the semiconductor substrate and one surface of each of the plurality of peripheral circuit side auxiliary bonding conductive patterns, and disposed between the plurality of conductive lines;
a second bonding insulating layer disposed in the second bonding array layer, the second bonding insulating layer penetrated by the plurality of cell array side bonding conductive patterns and the plurality of peripheral circuit side auxiliary bonding conductive patterns; and
a second insulating layer extending along one surface of the second bonding insulating layer facing the memory cell array and one surface of each of the cell array side auxiliary bonding conductive patterns.

12. The semiconductor memory device of claim 8, further comprising:
a first transistor and a second transistor disposed under the plurality of conductive lines,
wherein each of the first transistor and the second transistor includes a gate insulating layer and a gate electrode stacked on the semiconductor substrate, and junctions defined in the semiconductor substrate on both sides of the gate electrode.

13. The semiconductor memory device of claim 12,
wherein the plurality of conductive lines include a first conductive line connected to the junction of the first transistor and a second conductive line connected to the junction of the second transistor, and
the plurality of cell array side bonding conductive patterns includes a bit line connected to the channel structure and a plurality of connection patterns connected to each of the plurality of conductive patterns.

* * * * *